(12) United States Patent
Tsukamoto

(10) Patent No.: US 8,928,400 B2
(45) Date of Patent: Jan. 6, 2015

(54) SEMICONDUCTOR DEVICE HAVING FIRST AND SECOND DEMODULATION CIRCUITS FOR WIRELESS COMMUNICATION

(75) Inventor: Takayuki Tsukamoto, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 401 days.

(21) Appl. No.: 13/298,897

(22) Filed: Nov. 17, 2011

(65) Prior Publication Data

US 2012/0134444 A1 May 31, 2012

(30) Foreign Application Priority Data

Nov. 26, 2010 (JP) ................ 2010-263516

(51) Int. Cl.
- *H03D 1/00* (2006.01)
- *H04L 27/06* (2006.01)
- *H04B 5/00* (2006.01)

(52) U.S. Cl.
CPC .............. *H04B 5/0031* (2013.01); *H04L 27/06* (2013.01)
USPC ........... 329/347; 329/348; 455/338; 455/130; 455/152.2; 455/556.1; 340/10.1

(58) Field of Classification Search
CPC ............ G06F 3/033; H04Q 5/22; H04B 5/00; H04B 5/0031; G06K 19/00; H04L 27/06
USPC .............. 340/572.5, 10.1; 455/130, 110, 108, 455/338, 151.2, 556.1; 329/315, 327, 348, 329/347

See application file for complete search history.

(56) References Cited

U.S. PATENT DOCUMENTS 8,188,933 B2 5/2012 Nakamura et al.
2007/0026825 A1* 2/2007 Wilson .......................... 455/130

FOREIGN PATENT DOCUMENTS

JP  H11-232418  8/1999
JP  2000-172806  6/2000

OTHER PUBLICATIONS

Stmicroelectronics ST21NFCA Near Field Communication Microcontroller Data Sheet, Feb. 2008, 6 pages, available at http://www.st.com/internet/mcu/product/207640.jsp, retrieved Nov. 16, 2011.
XNP PN512 Transmission Module Data Sheet, Rev. 3.8—Oct. 25, 2011, 111338, 125 pages, available at http://www.nxp.com/products/interface_and_connectivity/nfc_devices/PN512.html retrieved Nov. 16, 2011.
Official Action dated Jul. 1, 2014 issued in Japanese counterpart application (No. 2010-263516) with translation.

* cited by examiner

*Primary Examiner* — Arnold Kinkead
(74) *Attorney, Agent, or Firm* — Womble Carlyle

(57) ABSTRACT

A device receives ASK signals by using an ASK signal receiving circuit that is different from an ASK signal receiving circuit for R/W mode, when an NFC-enabled semiconductor device operates in a mode other than the R/W mode. An ASK signal receiving circuit for 100% ASK is provided on the side of a pair of transmitting terminals. This arrangement eliminates the influence of an ESD provided within an ASK signal receiving circuit for 10% ASK coupled to a pair of receiving terminals. There is no need for management of threshold values that are different according to type of ASK and it is possible to support different modulation schemes by a smaller circuit configuration.

17 Claims, 27 Drawing Sheets

SEMICONDUCTOR DEVICE HAVING FIRST AND SECOND DEMODULATION CIRCUITS FOR WIRELESS COMMUNICATION

CROSS-REFERENCE TO RELATED APPLICATIONS

The disclosure of Japanese Patent Application No. 2010-263516 filed on Nov. 26, 2010 including the specification, drawings and abstract is incorporated herein by reference in its entirety.

BACKGROUND

The present invention relates to a circuit configuration, particularly, a circuit configuration implementing an NFC function in an environment where there is no power supply or using a power supply is restricted.

Equipping mobile phones (mobiles) with a Near Field Communication (NFC) function is now evolved, especially in Japan. In other countries, mobiles equipped with NFC are appearing on the market. Three modes are available in NFC: card mode, battery-less mode, and R/W (reader/writer) mode.

The R/W mode is a mode in which a mobile with NFC operates as a reader/writer and communicates with a PICC (IC card) existing in its surroundings. The card mode and battery-less mode are modes in which the mobile operates as a PICC and communicates with a reader/writer existing in its surroundings. A difference between the card mode and the battery-less mode is as follows: stable power is supplied externally in the card mode, whereas there is no such power in the battery-less mode.

Although three modes are available in NFC as mentioned above, a generally practiced development at the time of this application is such that a basic circuit design is typically made in the R/W mode and, on top of this basis, the remaining two modes are added. Therefore, in most cases, an ASK signal receiving circuit that is used in the R/W mode is also used in the card mode or battery-less mode.

NFC operations in the card mode, R/W mode, and battery-less mode (low consumption current mode) are well-known to those skilled in art, as exemplified by the following documents:

NXP NFC Controller PN544 for Mobile Phones and Portable Equipment, NXP Semiconductors http://www.nxp.com/documents/leaflet/75016890.pdf, retrieved 7 Nov. 2011.

ST21NFCA Near Field Communication Microcontroller, STMicroelectronics http://www.st.com/internet/mcu/product/207640.jsp, retrieved 7 Nov. 2011.

SUMMARY

Because it is presumed that a stable external power supply exists in the R/W mode, as noted above, a significant reduction of power consumption is often not considered when designing the ASK signal receiving circuit for the R/W mode.

An object of the present invention is to provide means for receiving ASK signals by using an ASK signal receiving circuit that is different from an ASK signal receiving circuit for the R/W mode, when an NFC-enabled semiconductor device operates in a mode other than the R/W mode.

The above-noted and other objects and novel features of the present invention will become apparent from the following descriptions in the present specification and the accompanying drawings.

Typical aspects of the invention disclosed in this application are summarized as follows.

A semiconductor device for wireless communication application pertaining to a typical embodiment of the present invention includes a first demodulation circuit to demodulate a first ASK modulated signal and a second demodulation circuit to demodulate a second ASK modulated signal. The first demodulation circuit and the second demodulation circuit are coupled in parallel. A first pair of input pins coupled to the first demodulation circuit and a second pair of input pins coupled to the second demodulation circuit exist separately.

The semiconductor device for wireless communication application may further include a driver circuit that drives an output of a modulated signal to be transmitted and the driver circuit may drive an antenna via the first pair of input pins.

In the semiconductor device for wireless communication application, the first demodulation circuit may be a 100% ASK signal receiving circuit and the 100% ASK signal receiving circuit and the driver circuit may be coupled in parallel to the first pair of input pins.

In the semiconductor device for wireless communication application, the second demodulation circuit may be a 10% ASK signal receiving circuit.

In the semiconductor device for wireless communication application, the 100% ASK signal receiving circuit may operate, triggered by a level and the 10% ASK signal receiving circuit may operate, triggered by an edge.

The semiconductor device for wireless communication application may further include a circuit for sharing a demodulation logic circuit. The demodulation logic circuit may judge whether the 10% ASK signal receiving circuit or the 100% ASK signal receiving circuit is enabled and select an output of the enabled receiving circuit as an output to the demodulation logic circuit.

In the semiconductor device for wireless communication application, the 10% ASK signal receiving circuit may include a current drawing circuit and achieve matching by controlling the current drawing circuit.

In the semiconductor device for wireless communication application, the first demodulation circuit may be a 10% ASK signal receiving circuit and the 10% ASK signal receiving circuit and the driver circuit may be coupled in parallel to the first pair of input pins.

In the semiconductor device for wireless communication application, the second demodulation circuit may be a 100% ASK signal receiving circuit.

Another semiconductor device for wireless communication application pertaining to a typical embodiment of the present invention includes a first demodulation circuit to demodulate a first ASK modulated signal, a second demodulation circuit to demodulate a second ASK modulated signal, and a driver circuit to transmit a modulated signal. The first demodulation circuit and the second demodulation circuit are coupled in parallel and input signals from a common pair of input pins are internally distributed to the first demodulation circuit and the second demodulation circuit.

By applying the present invention, suitable terminal amplitude control circuits can be coupled to receiving terminals RXINP, RXINN and transmitting terminals TP, TN to make it easy to receive signals in accord with their targeted demodulation schemes (receiving ASK is described in the foregoing context, but applicable schemes are not restrictive to ASK).

DETAILED DESCRIPTION

As for embodiments, as will be described hereinafter, a plurality of sections or embodiments are separately described, as necessary for the sake of expedience. Unless otherwise specified, however, these sections or embodiments are not independent of each other; rather, they correlate in such a manner that one of them provides an example of modification to or further detailed or supplementary explanation of another one of them in part or in whole. In embodiments, as will be discussed hereinafter, where the number of elements or the like (including the number of pieces, a value, a quantity, a range, etc.) is mentioned, unless otherwise specified and unless it is obviously limited to a given number in principle, it is not limited to the given number and may be either more than or less than the given number.

Moreover, it goes without saying that components of an embodiment, as will be discussed hereinafter, are not always indispensable ones, unless otherwise specified and unless a component is obviously considered as indispensable in principle. Although not restrictive, circuit elements making up each function block of an embodiment are formed over a semiconductor substrate like monocrystalline silicon by integrated circuit technology such as CMOS (Complementary MOS Transistor). MOSFET (Metal Oxide Semiconductor Field Effect Transistor; or abbreviated to MOSFET transistor), if mentioned in an embodiment, does not exclude a non-oxide film as a gate insulation film.

In the following, technology underlying the invention and embodiments of the invention will be described, using the drawings.

Technology Underlying the Invention

Figure 1:
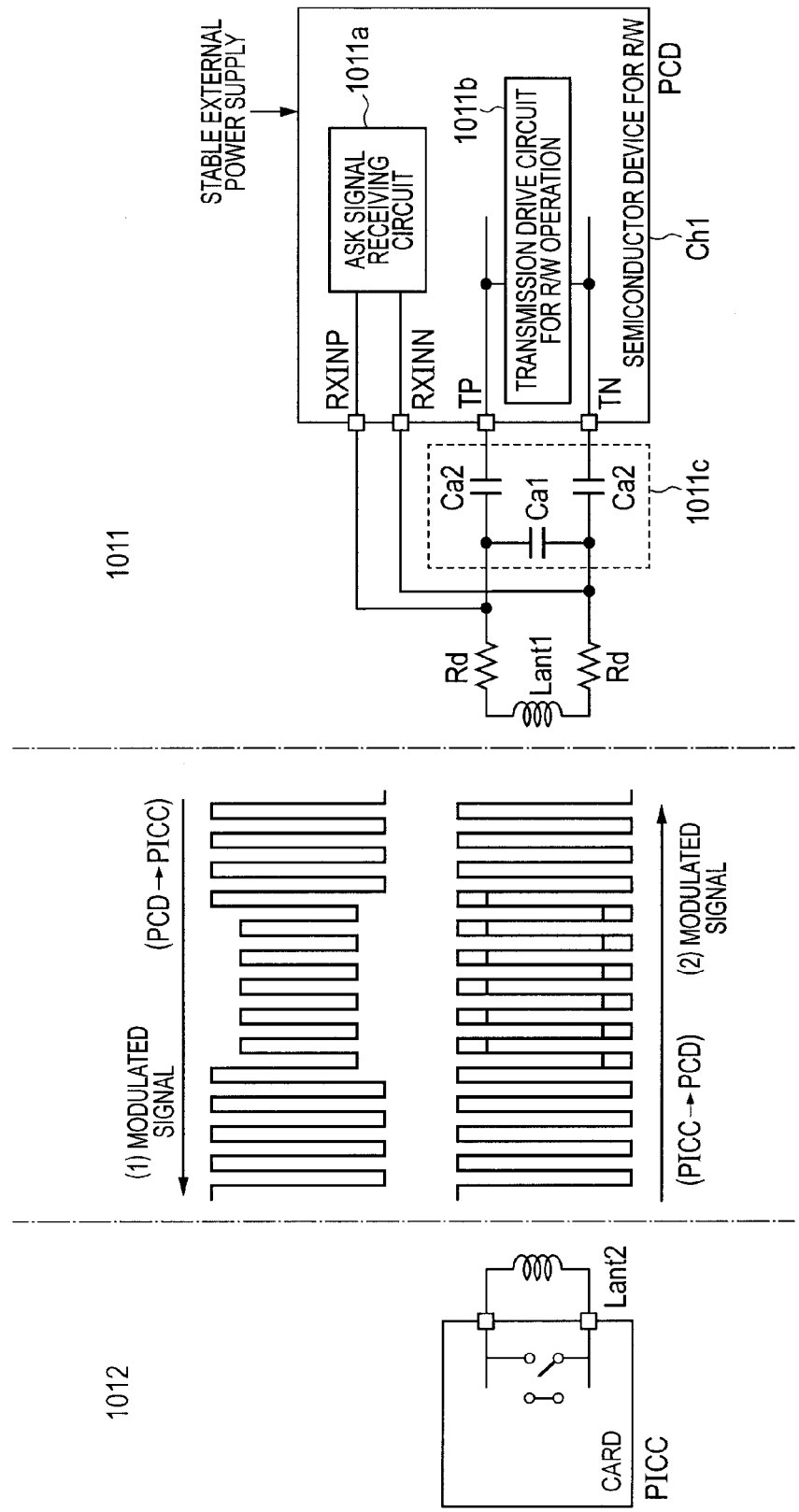
FIG. 1 is a conceptual diagram representing NFC operation in an R/W mode in an existing mobile phone.
Figure 2:
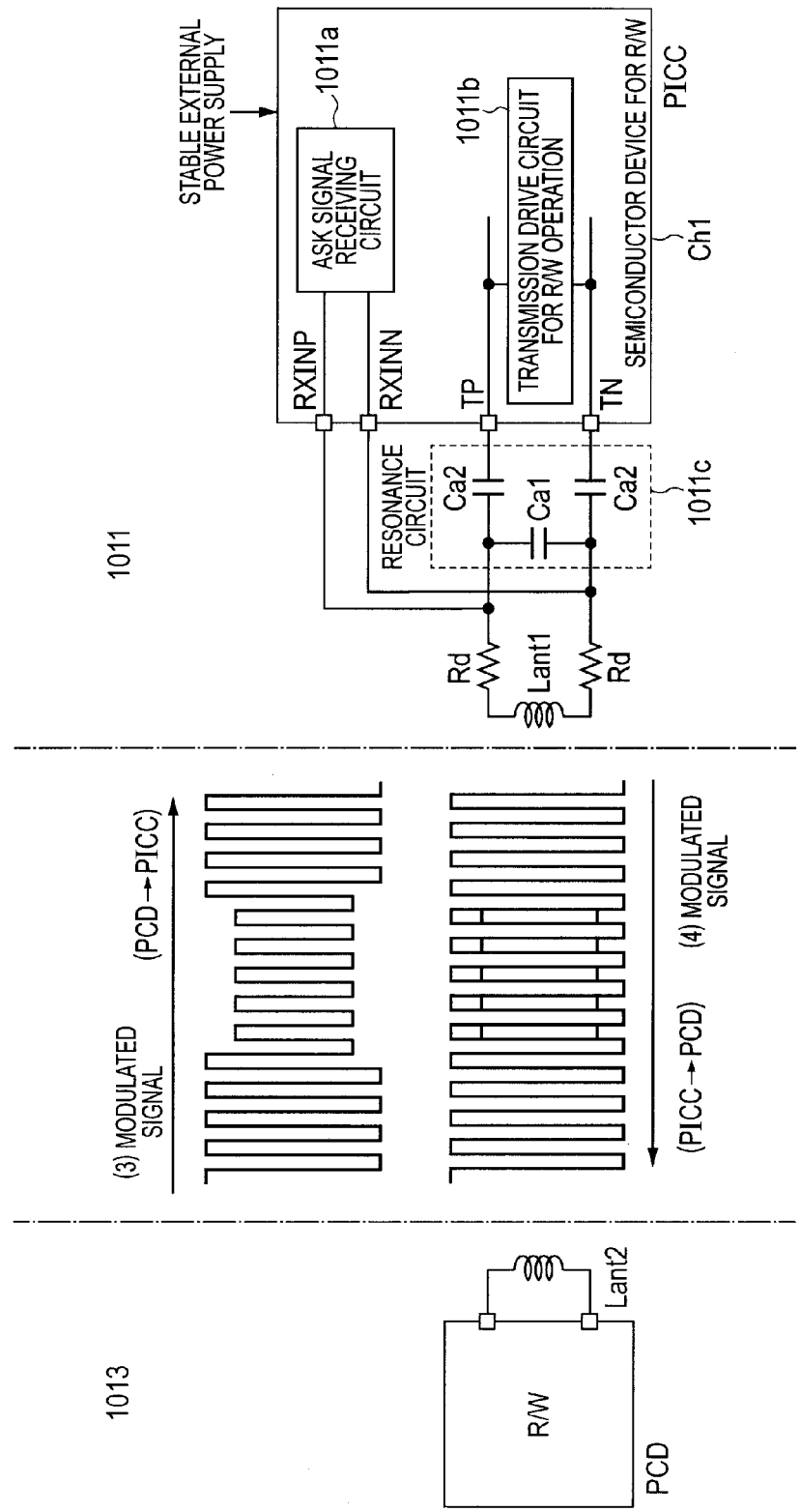
FIG. 2 is a conceptual diagram representing NFC operation in a card mode in an existing mobile phone.
Figure 3:
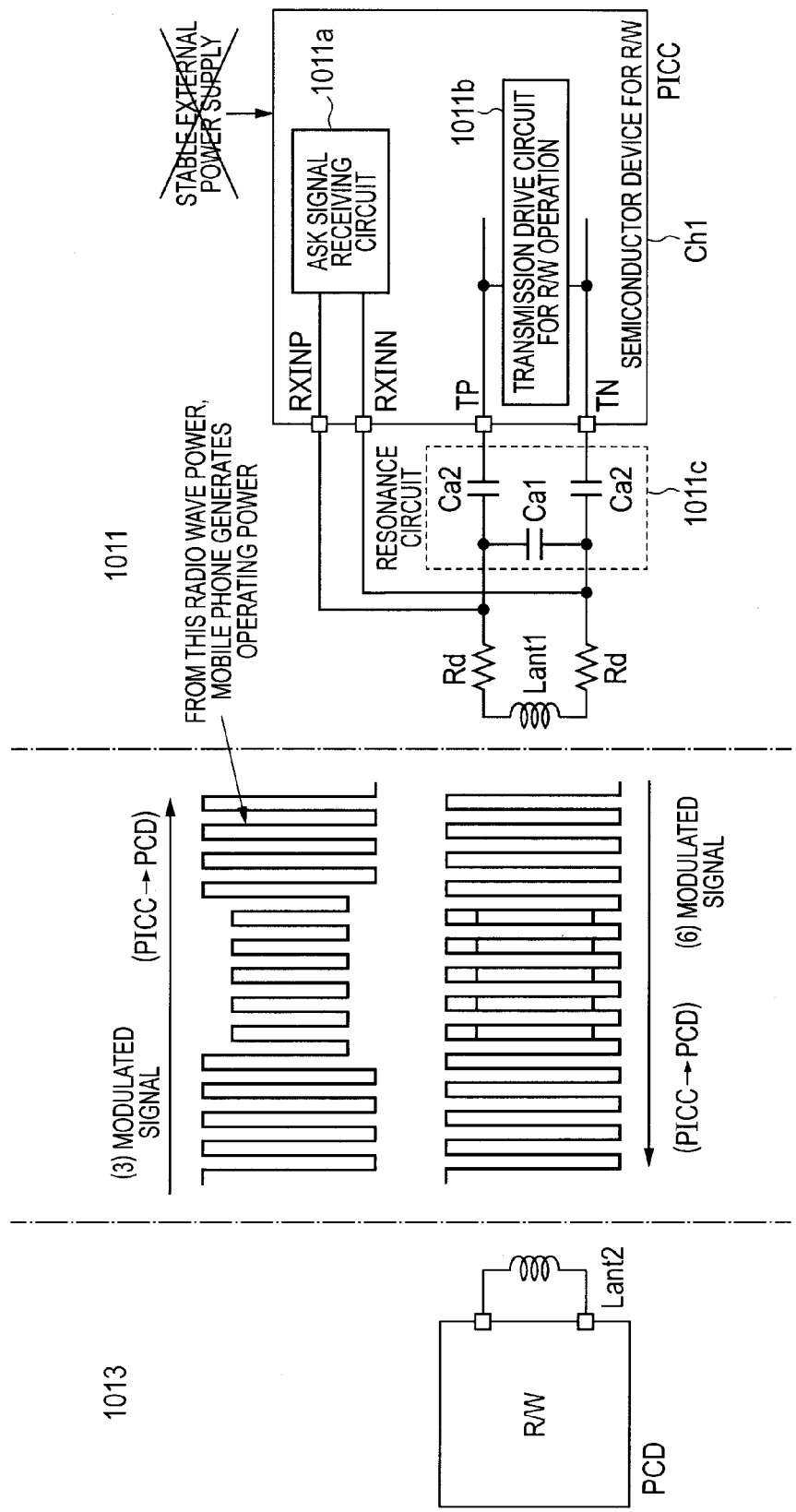
FIG. 3 is a conceptual diagram representing NFC operation in a battery-less mode in an existing mobile phone.

FIG. 1 is a conceptual diagram representing NFC operation in an R/W mode in an existing mobile phone 1011. A description in the following paragraphs concerns a mobile phone which is taken as an example, but is not intended to be limited to mobile phones. FIG. 2 is a conceptual diagram representing NFC operation in a card mode in an existing mobile phone 1011. FIG. 3 is a conceptual diagram representing NFC operation in a battery-less mode in an existing mobile phone 1011. Using these figures, technology underlying the invention is discussed. Here, the following discussion proceeds on the assumption that the NFC function is implemented in the mobile phone 1011.

The NFC of the existing mobile phone 1011 is configured, including an ASK signal receiving circuit 1011a, a transmission drive circuit for R/W operation 1011b, and a resonance circuit 1011c. Among them, the ASK signal receiving circuit 1011a and the transmission drive circuit for R/W operation 1011b are arranged, included in a semiconductor device for R/W Ch1.

The semiconductor device for R/W Ch1 has two pairs of receiving terminals RXINP, RXINN and transmitting terminals TP, TN. The receiving terminals RXINP, RXINN are the terminals to which the ASK signal receiving circuit 1011a is coupled and the transmitting terminals TP, TN are the terminals to which the transmission drive circuit for R/W operation 1011b is coupled.

In the R/W mode and the card mode, stable power is supplied externally. On the other hand, in the battery-less mode, there is no stable power supply.

In operation in the R/W mode, the above-mentioned two pairs of the receiving terminals RXINP, RXINN and the transmitting terminals TP, TN are both used.

In the R/W mode, first, the mobile phone 1011 drives its antenna Lant1 and outputs a modulated signal (FIG. 1 (1)). More specifically, when transmitting, the transmission drive circuit for R/W operation 1011b of the mobile phone 1011 drives the transmitting terminals TP, TN. The amplitude of a signal that is output from the transmitting terminals TP, TN is modulated as determined by the transmission drive circuit for R/W operation 1011b, so that the modulated signal (FIG. 1(1)) with the thus modulated amplitude is output.

A card 1012 receives this modulated signal from the mobile phone 1011 and, after carrying out internal processing, outputs a modulated signal (FIG. 1(2)) to the mobile phone 1011.

This output (FIG. 1(2)) from the card 1012 to the mobile phone 1011 is performed in such a way that, when the mobile phone 1011 outputs an unmodulated carrier, the card 1012 changes input impedance and modulates the unmodulated carrier output by the mobile phone 1011. The mobile phone 1011 receives this signal and carries out communication.

When sending from the card 1012 to the mobile phone 1011, the signal modulated by the card 1012 does not appear at the transmitting terminals TP, TN, because the transmitting terminals TP, TN are driven. Then, receiving operation is performed in such a way that the ASK signal receiving circuit 1011a captures a change in impedance appearing at the receiving terminals RXINP, RXINN.

Although there are various forms of configurations with these two pairs of terminals, typical ones are as follows.

Figure 4:
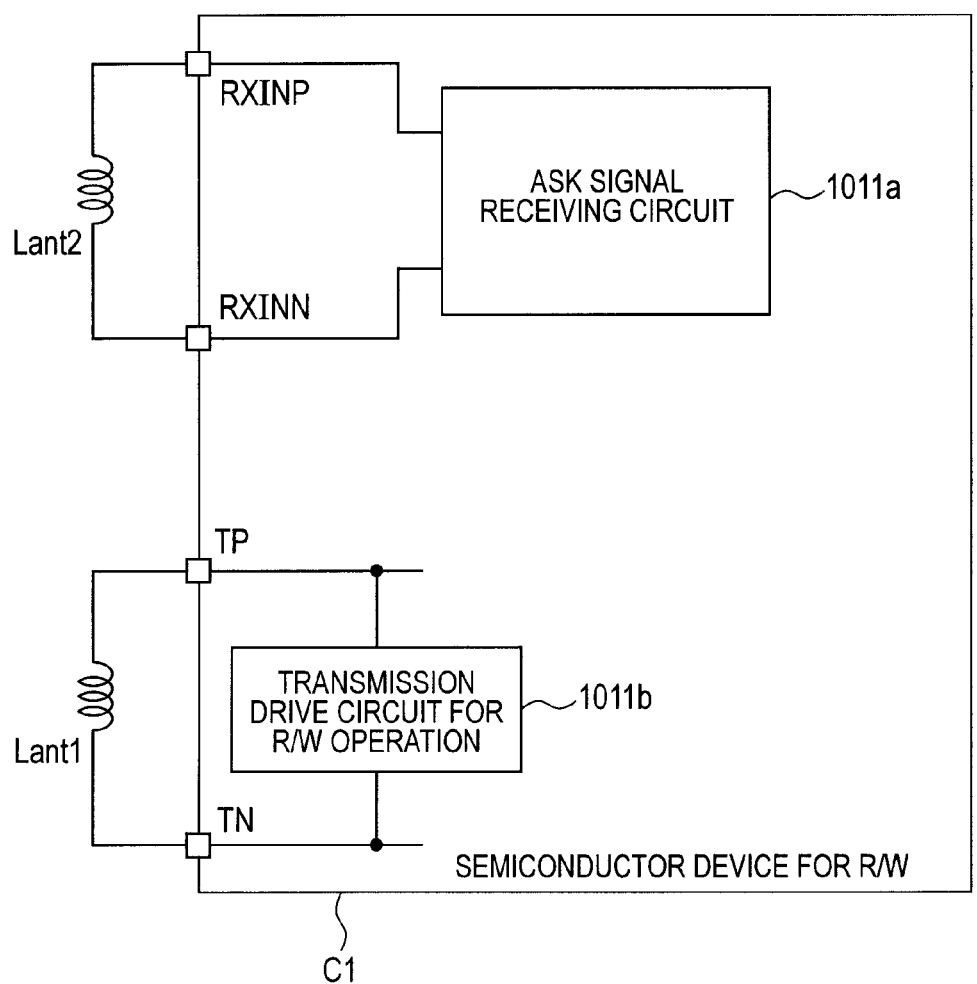
FIG. 4 is a structural diagram of an existing mobile phone adopting a way in which separate antennas are provided for transmission and reception respectively.

That is, one way is using an antenna in common use for transmission and reception as shown in FIG. 1 and another way is providing separate antennas for transmission and reception respectively. FIG. 4 is a structural diagram of an existing mobile phone 1011 that adopted the latter way in which separate antennas are provided for transmission and reception respectively.

What is a significant difference between the way in which an antenna in common use for transmission and reception is used, as shown in FIG. 1, and the way in which separate antennas are provided for transmission and reception respectively, as in FIG. 4, is whether or not the resonance circuit 1011c is present. Owing to the presence of this resonance circuit 1011c, it becomes possible to separate a signal that is returned (with a modulated component) from the card 1012 and input to the receiving terminals RXINP, RXINN and a signal that the transmission drive circuit for R/W operation 1011b outputs via the transmitting terminals TP, TN.

Operation in the card mode is just reverse to the foregoing operation. That is, by changing input impedance for a modulated signal (FIG. 2(3)) transmitted from a reader/writer 1013 that exists externally, output to the reader/writer 1013 is performed.

Operation in the battery-less mode is also the same as for the card mode. However, the mobile phone 1011 itself generates a power supply voltage by deriving power from a modulated signal (FIG. 3(5)) that is provided from the reader/writer 1013 and performs an output operation (FIG. 3(6)) with that voltage.

As can be understood from the foregoing, the mobile phone itself needs to drive the antenna in the R/W mode, but it is not necessary to drive the antenna in other two modes. Therefore, the card mode and the battery-less mode allows the mobile phone to operate with low power consumption. This is because the resonance circuit 1011c does not need to operate in the card mode and the battery-less mode.

However, because, in the battery-less mode, the operating voltage is generated from a signal provided by the reader/writer 1013, it is necessary for the mobile phone to, especially, operate with low consumption current. If the mobile phone is unable to operate with low consumption current, its communication itself would be impossible.

Even in the card mode, an external power supply is most often sourced from a secondary battery of the mobile phone 1011. Considering time over which the mobile phone 1011 runs, an increase in power consumption is undesirable.

Accordingly, taking suitability for the battery-less mode or card mode into consideration, it is unsuitable to use an ASK signal receiving circuit that consumes large current like a hitherto known circuit. Besides, its circuit configuration cannot be regarded as optimum for the card mode and battery-less mode.

If the semiconductor device for R/W Ch1 is to be adapted to implement a plurality of specifications, the device must be capable of supporting a plurality of modulation schemes.

For example, it is assumed that the device (mobile phone) only uses an amplitude modulation (ASK) as a modulation scheme. For ASK, given that unmodulated amplitude (full amplitude) is denoted by A and modulated amplitude (smaller amplitude) is denoted by B, a modulation factor is defined as $((A-B)/(A+B))\times 100(\%)$.

Then, if B=0, the modulation factor will be 100%. This signal is referred to as "100% ASK".

If A=110 and B=90, the modulation factor will be 10%. This signal is referred to as "10% ASK".

As above, in a case where amplitude is modulated at very different modulation factors even when a same modulation scheme is used, separate ASK signal receiving circuits need to be provided independently or an ASK signal receiving circuits capable of handling two modulation factors needs to be provided.

However, such an ASK signal receiving circuits capable of handling two modulation factors would have a complicated circuit configuration and consume large current.

In another case where a plurality of separate ASK signal receiving circuits are provided independently, two or more pairs of receiving terminals RXINP, RXINN would be necessary. This means increasing the number of external output pins of the semiconductor device for R/W Ch1 and should become a cost increasing factor.

Figure 24:
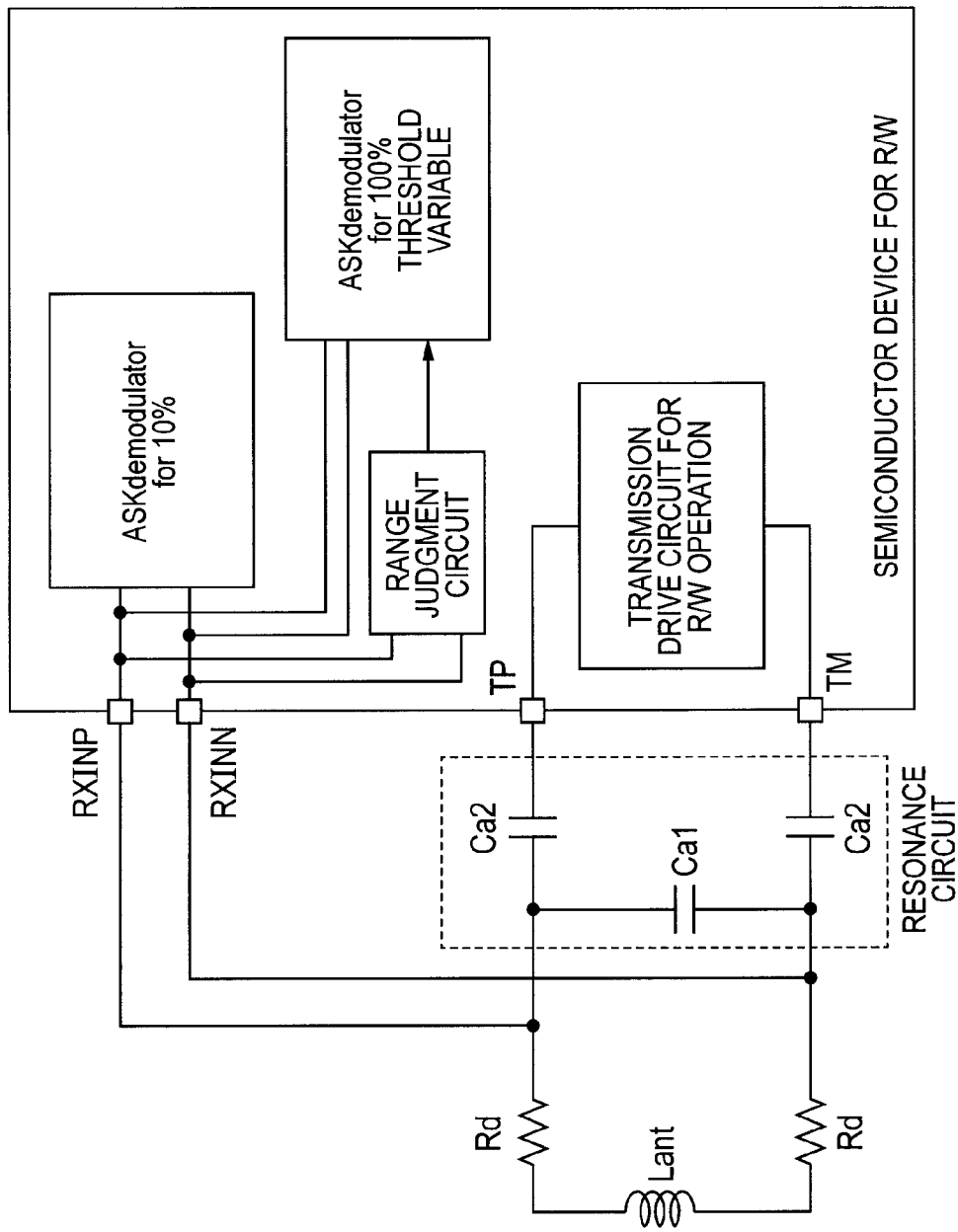
FIG. 24 is a circuit diagram showing a circuit configuration in which a 10% ASK signal demodulation circuit and a 100% ASK signal demodulation circuit are coupled to enable demodulation of both signals.

Coupling two modulators in parallel to a same pin also involves a problem. Essentially, an ESD element is coupled to an external coupling pin for a countermeasure against surge or the like. Therefore, potential that can be input via the pin is constrained such that it is limited to a level of a power supply voltage+Vth (even if the input pin has no coupling to an ESD element, the input potential is constrained by dielectric strength of internal circuit elements). Accordingly, it is necessary to avoid clamping signal components that are required to be received. FIG. 24 is a circuit diagram showing a circuit configuration in which a 10% ASK signal demodulation circuit and a 100% ASK signal demodulation circuit which are used in the NFC by way of example are coupled to enable demodulation of both signals.

Figure 7:
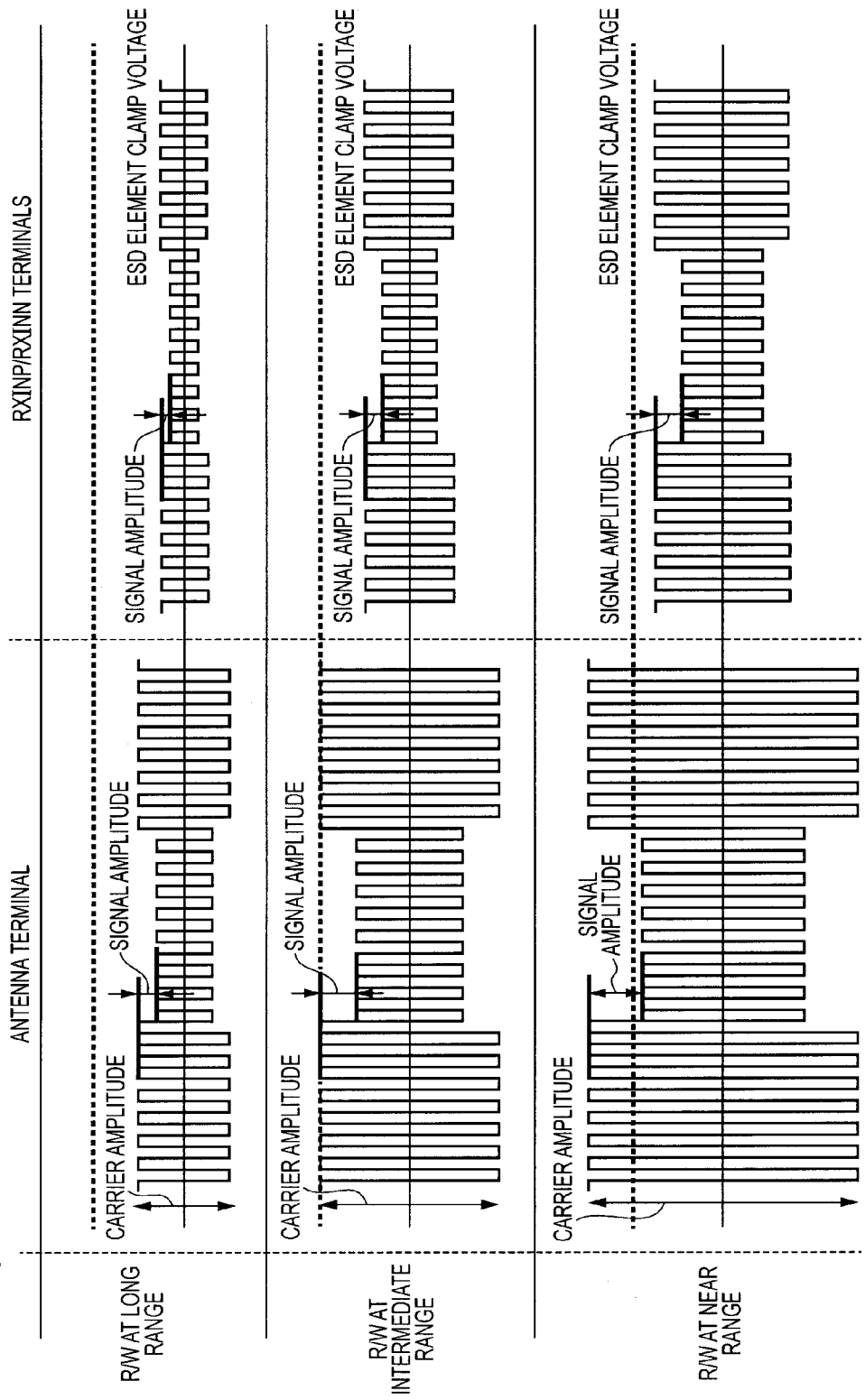
FIG. 7 is a waveform diagram representing an image of how a signal is attenuated by a resistor divider attenuation circuit.

A semiconductor circuit for receiving ASK needs to operate for communication from near range to long range. When receiving an ASK signal, the signal amplitude that appears at a receiving pin varies depending on a distance from a reader/writer and a card. In order to handle a 10% ASK modulated signal, control should be performed so that even an unmodulated amplitude that is largest at near distance does not exceed the power supply voltage+Vth. When such control is performed, the signal with a small amplitude is received at long range, as can be seen in FIG. 7.

The simplest configuration as a receiver for a 100% ASK modulated signal is to set a threshold value between an unmodulated amplitude and a modulated amplitude and make the receiver judge by the threshold value whether a received signal has the unmodulated amplitude or the modulated amplitude. A modulation factor specification for the 100% ASK modulated signal ranges from 100% to 94.5%. If the modulation factor is 94.5%, the amplitude remains even when it is modulated.

At a pin for receiving a 10% ASK modulated signal, amplitude appearing at the pin when it is unmodulated largely differs depending on distance. Such a condition arises that a modulated amplitude at a modulation depth of 94.5% at near range and an unmodulated amplitude at long range invert in magnitude. In other words, there is no threshold value between an unmodulated amplitude and a modulated amplitude, when taking communication from long range to near range into consideration. Therefore, in a case where a 10% ASK modulator and a 100% ASK modulator are coupled to a same pin, it is necessary to receive 100% signals by a complicated circuit configuration.

If a 10% ASK signal demodulation circuit and a 100% ASK signal demodulation circuit are coupled to RXIN, the 100% ASK signal demodulation circuit cannot be implemented with a circuit configuration having one threshold value.

Because the 10% ASK signal demodulation circuit needs to demodulate a small amplitude, its existing configuration should not be changed, whereas the 100% ASK signal demodulation circuit should be changed. Such a method is conceivable that the 100% ASK signal demodulation circuit is provided with a capability of range judgment and a threshold for the 100% ASK signal demodulation circuit is varied. When it is envisioned that all signals are received at RXIN in this way, processing that is more complicated than the existing circuit would be necessary, as can be seen in FIG. 24.

First Embodiment

As discussed above, when operation in the R/W mode is assumed to be implemented with an antenna in common use for transmission and reception, it is essential to operate the resonance circuit 1011c for the purpose of signal separation.

However, signal separation is not necessary in the card mode and the battery-less mode. This is because the mobile phone in these modes is designed to change its input impedance and does not make output positively.

When it is foreseen to receive a 10% ASK modulated signal and a 100% ASK modulated signal at separate pins, the 100% ASK receiving circuit can determine a threshold value as mentioned above very easily. Because this circuit does not receive 10% ASK signals, an unmodulated amplitude can be clamped by an ESD element (or a rectification circuit and a clamp circuit), whether at near range or at long range. The above threshold value can be set at a potential slightly lower than a clamp voltage.

In the present invention, two receiving circuits are provided and one of these circuits has receiving terminals RXINP, RXINN for interface, as in the existing configuration. The remaining one receiving circuit uses transmitting terminals TP, TN, thereby making it possible to offer a solution without increasing the number of external output pins of the semiconductor device for R/W Ch1.

Figure 5:
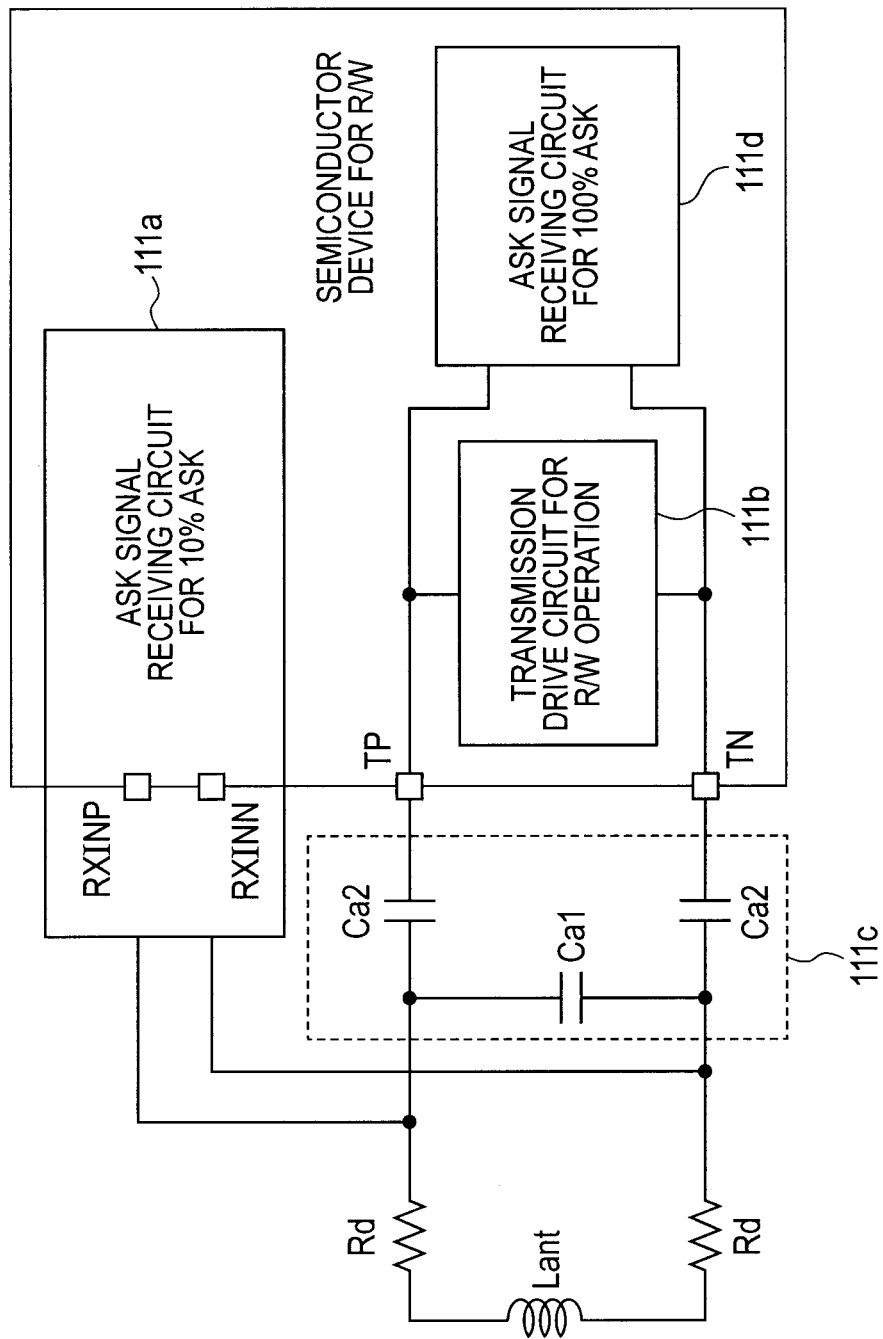
FIG. 5 is a conceptual diagram representing an NFC configuration in a mobile phone according to a first embodiment of the present invention.
Figure 6:
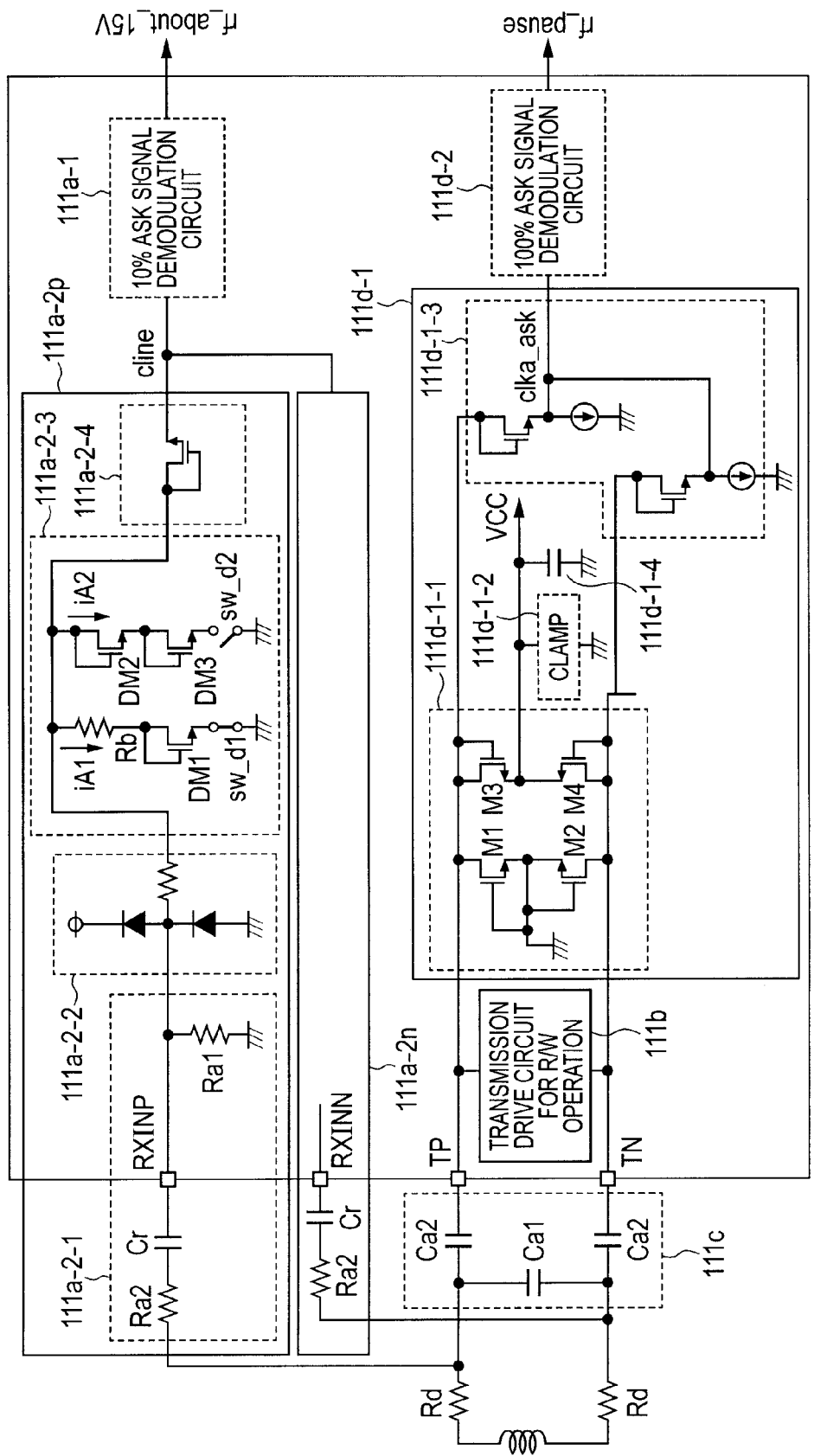
FIG. 6 is a circuit diagram representing details on the NFC configuration in the mobile phone according to the first embodiment of the present invention.

FIG. 5 is a conceptual diagram representing an NFC configuration in a mobile phone 111 according to a first embodiment of the present invention. FIG. 6 is a circuit diagram representing details on the NFC configuration in the mobile phone 111 according to the first embodiment of the present invention. FIG. 5 and FIG. 6 represent the same circuit and its components that are identical are assigned the same reference numerals. A sub-component included in a component is assigned a reference numeral in a form in which the same reference numeral as the component is suffixed with a number (e.g., a ASK signal receiving circuit for 10% ASK 111a and a 10% ASK receiving terminal signal control circuit 111a-2 included therein).

The NFC of this mobile phone 111 is configured, including an ASK signal receiving circuit for 10% ASK 111a, a transmission drive circuit for R/W operation 111b, a resonance circuit 111c, and an ASK signal receiving circuit for 100% ASK 111d.

In this circuit, the ASK signal receiving circuit for 10% ASK 111a is coupled to the receiving terminals RXINP, RXINN. Whereas, the ASK signal receiving circuit for 100% ASK 111d is coupled to the transmitting terminals TP, TN in an arrangement in which it is coupled in parallel with the transmission drive circuit for R/W operation 111b.

The ASK signal receiving circuit for 10% ASK 111a is an ASK signal receiving circuit comprised of circuits inside and outside the semiconductor device for R/W Ch1.

The transmission drive circuit for R/W operation 111b is a driver for transmitting radio waves from the antenna when R/W operation is performed.

The resonance circuit 111c is a circuit for separating an input signal from the antenna Lant and a transmission signal by the transmission drive circuit for R/W operation 111b.

The ASK signal receiving circuit for 100% ASK 111d is an ASK signal receiving circuit comprised of circuits inside and outside the semiconductor device for R/W Ch1. This circuit is coupled to the transmitting terminals TP, TN in parallel with the transmission drive circuit for R/W operation 111b and this arrangement is a feature of the present invention.

Then, the configuration of the present invention is described in detail, using FIG. 6.

The ASK signal receiving circuit for 10% ASK 111a is broadly divided into two sections; that is, it is configured, including a 10% ASK signal demodulation circuit 111a-1 and a 10% ASK receiving terminal signal control circuit 111a-2. Further, the 10% ASK receiving terminal signal control circuit 111a-2 is configured, including a 10% ASK receiving terminal signal control circuit 111a-2p for a positive side and a 10% ASK receiving terminal signal control circuit 111a-2n for a negative side. The 10% ASK receiving terminal signal control circuit 111a-2p and the 10% ASK receiving terminal signal control circuit 111a-2n are identical (with only a difference that these circuits are coupled to different terminals). Therefore, no discrimination between them will be made in the following description.

The 10% ASK signal demodulation circuit 111a-1 is a circuit that modulates a 10% ASK signal. Its details will be described with regard to FIG. 10.

The 10% ASK receiving terminal signal control circuits 111a-2p, 111a-2n are control circuits for controlling the receiving terminals RXINP, RXINN, respectively. Within these circuits, a resistor divider attenuation circuit 111a-2-1, an ESD 111a-2-2, a variable forward-stage current drawing circuit 111a-2-3, and a diode-coupled MOS 111a-2-4 are included.

The resistor divider attenuation circuit 111a-2-1 is a voltage dividing circuit for matching an input signal. For this resistor divider attenuation circuit 111a-2-1, not only a resistor Ra1 inside the semiconductor device for R/W Ch1, but also a resistor Ra2 and a capacitor Cr outside the semiconductor device for R/W Ch1 are included in its configuration.

By these resistors Ra1 and Ra2, signal amplitude at the antenna terminal is attenuated. Attenuation by this resistor divider attenuation circuit 111a-2-1 is simply based on dividing a voltage by the resistors and signal amplitude will be attenuated at a given ratio without regard to whether carrier amplitude is large or small.

FIG. 7 is a waveform diagram representing an image of how a signal is attenuated by this resistor divider attenuation circuit 111a-2-1. This diagram is intended to explain the waveforms of signals received at the antenna terminal and the waveforms of attenuated signals received at the receiving terminals RXINP, RXINN in three cases of R/W operation at different distances between a reader/writer and a card; i.e., at long range, at near range, and at intermediate range.

The carrier amplitude becomes largest when the distance between the reader/writer and the card is shortest. Conversely, the carrier signal amplitude becomes smaller as the distance becomes longer.

Since the use of the attenuator provides attenuation at a given ratio without regard to whether the distance is long or short, the demodulation condition becomes worse as the distance between the reader/writer and the card becomes longer.

A difference between the resistor divider attenuation circuit 111a-2-1 of the present invention and a hitherto known resistor divider attenuation circuit is as follows. That is, the hitherto known resistor divider attenuation circuit is designed to achieve matching only by this circuit. On the other hand, the resistor divider attenuation circuit 111a-2-1 of the present invention has substantially no function of achieving matching only by itself. That is, an arrangement is made such that matching is achieved by current drawing that is carried out by the variable forward-stage current drawing circuit 111a-2-3 in the following stage.

Signal amplitude is attenuated at a ratio as determined by Ra1/(Ra1+Ra2) (where Ra1, Ra2 are resistance values of the corresponding resistors in FIG. 6). Hence, given that the resistance value of the resistor Ra1 is 100 kΩ and the resistance value of the resistor Ra2 is 1 kΩ, the resistor divider attenuation circuit 111a-2-1 has an attenuation rate of 100/101. It may also be possible to put the resistor divider circuit in a state that it almost does not operate. The resistor divider attenuation circuit 111a-2-1 of the present invention is configured in this way (specific resistance values vary depending on external circuit configurations, antenna and communication power conditions, frequencies to be used, etc.).

Figure 28:
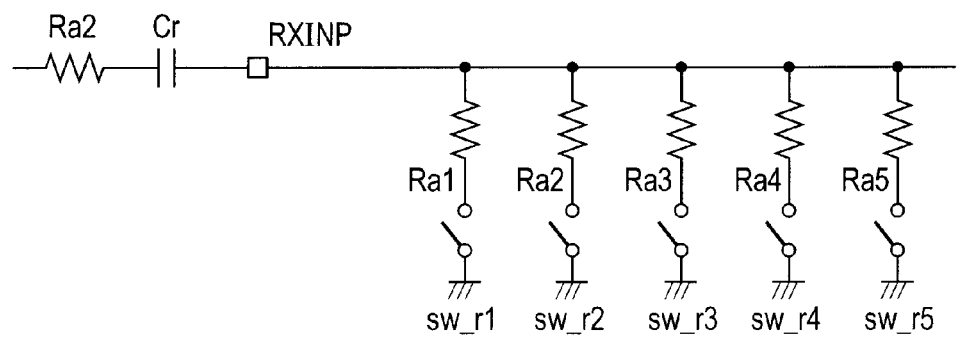
FIG. 28 is a circuit diagram representing another form of the resistor divider attenuation circuit pertaining to the present invention.

Designing the resistor divider attenuation circuit 111a-2-1 so that this circuit can be trimmed is also embraced in the scope of the present invention. FIG. 28 is a circuit diagram representing another form of the resistor divider attenuation circuit 111a-2-1 pertaining to the present invention. As seen in FIG. 28, each of a plurality of resistors having different values is connected between a common node and ground via a corresponding switch. The common node is connected to one of the second pair of inputs pins RXINP and RXINN. Turning on/off a corresponding switch adjusts the resistor divider attenuation circuit. Thus, shown in this figure, variable resistance values of grounded resistors can be obtained by turning the corresponding switches on/off, thereby making an adjustment of the resistor divider attenuation circuit 111a-2-1, which is also embraced in the scope of the present invention.

The ESD 111a-2-2 is a protection circuit for a countermeasure against surge. It also has a function for clamping so that a voltage above a certain level cannot flow in the 10% ASK signal demodulation circuit 111a-1.

The variable forward-stage current drawing circuit 111a-2-3 is configured, including a switch sw_d1 which generates a drawn current iA1 and a switch sw_d2 which generates a drawn current iA2.

The drawn current iA1 is a current that starts to be drawn at a voltage close to a threshold voltage (Vth) of a diode-coupled MOS (DM1). A resistor Rb is inserted in front of the MOS (DM1). Thereby, a current that is proportional to a terminal voltage flows as the drawn current iA1.

On the other hand, the drawn current iA2 is a current that is drawn from a circuit in which diode-coupled MOSs (DM2) and (DM3) are coupled in series. The drawn current iA2 is to start to flow at a voltage close to a threshold voltage (2Vth) for two stages of the dual diode-coupled MOSs. Unlike the drawn current iA1, no resistor is inserted and, thus, a current for a terminal voltage raised to the second power flows as the drawn current iA2.

By adopting such a circuit configuration, when a low voltage is applied to each of the receiving terminals RXINP, RXINN, none of the drawn currents are generated and, therefore, no attenuation occurs. When the voltage at these terminals, i.e., the terminal voltage rises and has exceeded the threshold voltage (Vth), the drawn current iA1 starts to flow. When the terminal voltage further rises and has exceeded the threshold voltage (2Vth), the drawn current iA2 starts to flow.

Figure 8:
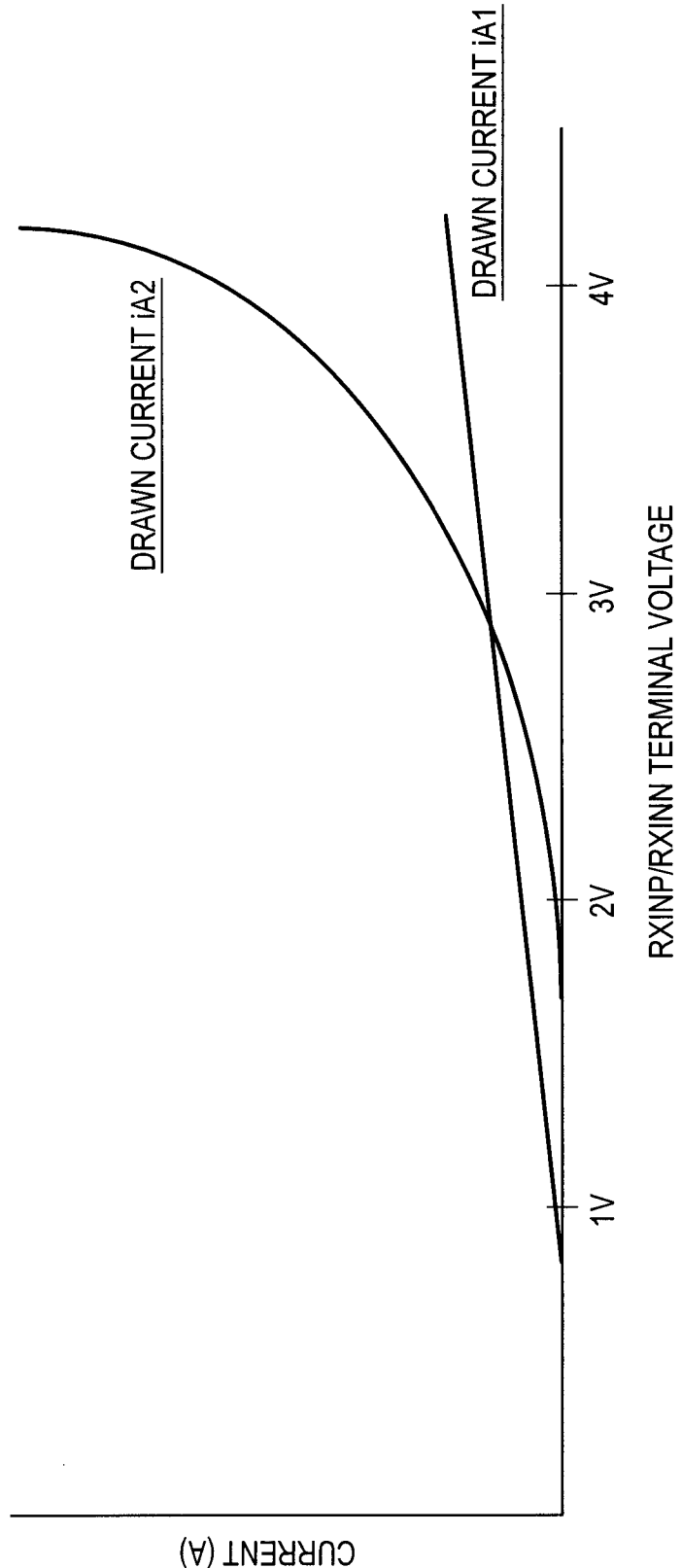
FIG. 8 is a graph representing the operation of a variable forward-stage current drawing circuit.

As mentioned above, the drawn current iA1 increases linearly and the drawn current iA2 increases exponentially (which is raised to the second power). By taking advantage of these natures of the drawn currents, it is possible to increase the attenuation rate when the voltage is high and decrease the attenuation rate when the voltage is low. FIG. 8 is a graph representing this operation of the variable forward-stage current drawing circuit 111a-2-3.

By coupling the variable forward-stage current drawing circuit 111a-2-3 in this way, it is possible to change the attenuation rate depending on communication from near range to long range, even if the ESD 111a-2-2 is coupled to the input terminal.

Figure 26:
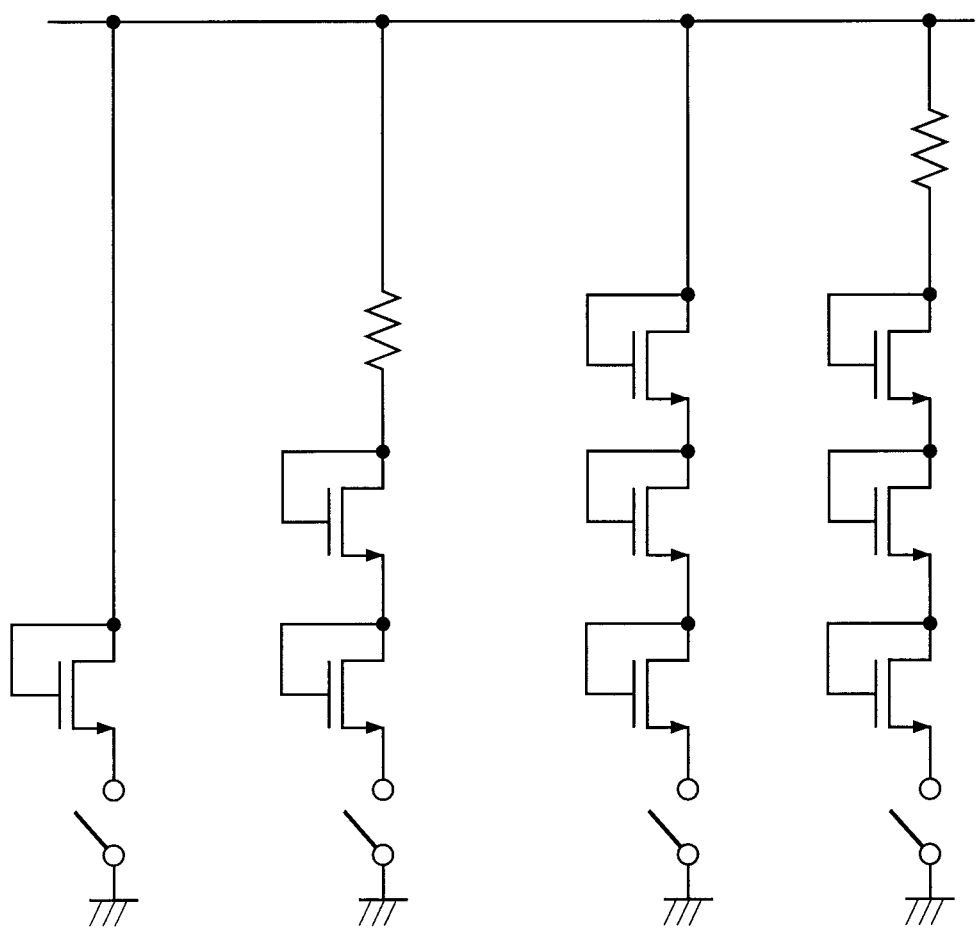
FIG. 26 is a circuit diagram representing another configuration of the variable forward-stage current drawing circuit.
Figure 27:
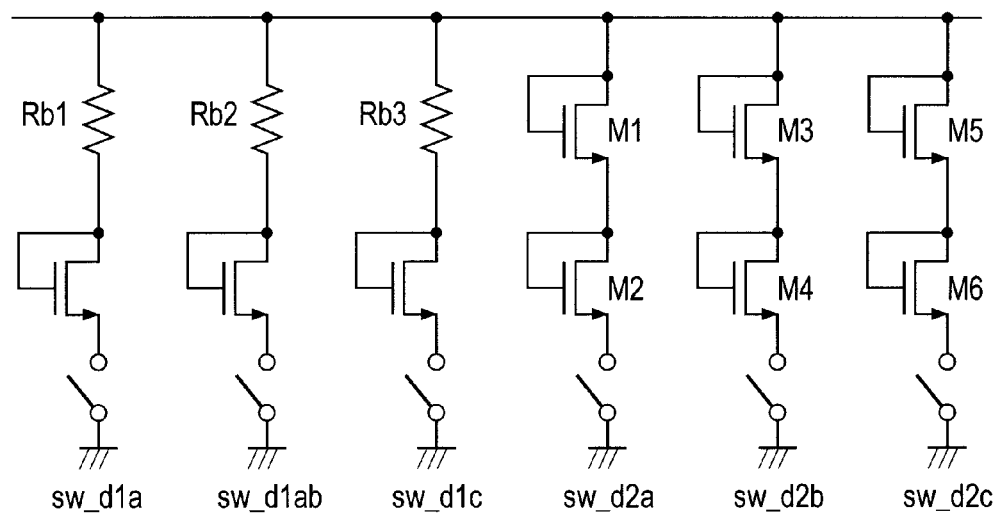
FIG. 27 is a circuit diagram representing another configuration of the variable forward-stage current drawing circuit.

It should be noted that the configuration of the variable forward-stage current drawing circuit 111a-2-3 as shown in FIG. 6 is just exemplary. By some other configurations of this circuit, it is also possible to implement control in more detail. FIG. 26 is a circuit diagram representing another configuration of the variable forward-stage current drawing circuit 111a-2-3. In FIG. 26, the variable forward-stage current drawing circuit has a plurality of selectively switchable current paths are provided between a common node and ground, each path having one or more diode-coupled MOSs with some paths having a resistor in series. FIG. 27 is a circuit diagram representing another configuration of the variable forward-stage current drawing circuit 111a-2-3. In FIG. 27, the variable forward-stage current drawing circuit has a plurality of selectively switchable current paths are provided between a common node and ground, a first number of paths having a diode-coupled MOSs in series with resistors of different resistance values Rb1, Rb2, Rb3, and a second number of paths having one or more diode-coupled MOSs, each of which may have a different threshold voltage, as represented by M1, M2, M3, M4, M5, M6. Even if the current drawing circuit is modified with an increased number of current drawing stages, like those as shown in FIGS. 26 and 27, the present invention can be applied.

The diode-coupled MOS 111a-2-4 is a rectification circuit for constraining a current flow in a direction from the antenna to the 10% ASK signal demodulation circuit 111a-1. Besides, envelope detection is carried out by this diode-coupled MOS 111a-2-4, so that signal components only can be extracted.

An advantageous effect which may occur by adopting the configuration of the present invention is now explained.

Figure 9:
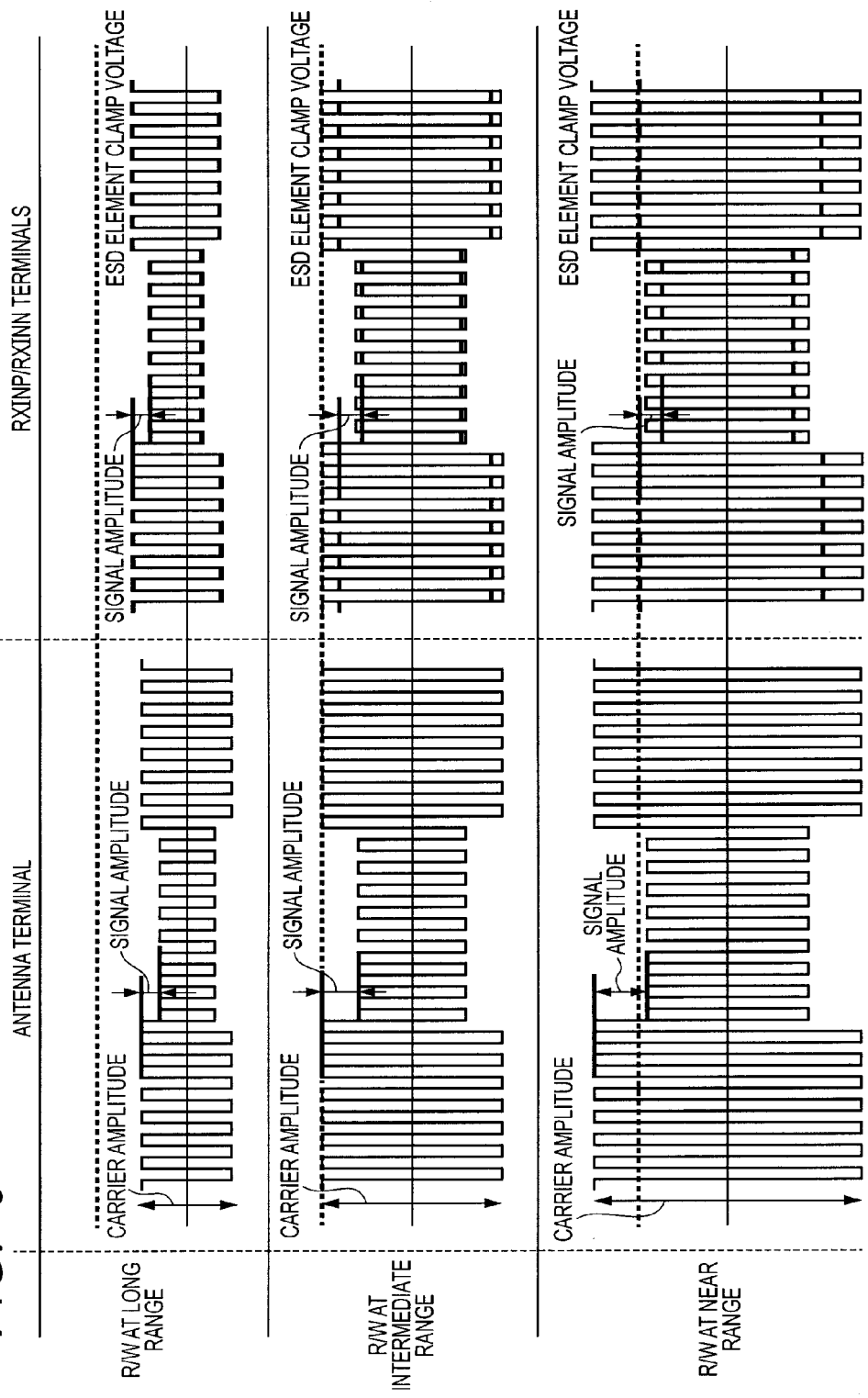
FIG. 9 is a waveform diagram representing an image of how a signal is attenuated in relation to the first embodiment of the present invention.

FIG. 9 is a waveform diagram representing an image of how a signal is attenuated in relation to the first embodiment of the present invention. This figure corresponds to FIG. 7 and input signals at the antenna terminal have the same waveforms as in FIG. 7.

In contrast to FIG. 7 for the same input signals, output signals in FIG. 9 have different waveforms from those shown in FIG. 7. That is, in FIG. 7, the signals are attenuated at a given ratio in all conditions as to distance between the card and the reader/writer.

In contrast, in FIG. 9 in relation to the present invention, at long range (right in an upper row in FIG. 9), there is little attenuation of the signal, as the drawn current iA1 and the drawn current iA2 are not generated. This is because the voltage of the input signal does not reach the threshold voltage (Vth).

Meanwhile, if there is no attenuation of the signal at intermediate range (right in a middle row in FIG. 9) and at near range (right in a lower row in FIG. 9), a condition will arise that the voltage is clamped by the diode of the ESD 111a-2-2 and there is substantially no signal amplitude. Even if the signal is somewhat attenuated, it can be demodulated because of a large carrier amplitude. Therefore, attenuation is performed in theses two situations, i.e., at intermediate range and at near range.

When the signal is attenuated, the attenuation rate is to vary depending on how large the drawn current iA1 and the drawn current iA2 are.

The amplitude of carriers received at the receiving terminals RXINP, RXINN largely varies depending on antenna forms, external circuit configurations, etc. Therefore, in a case where a significant change in the signal level is to take place, it is needed to adjust the entire signal to an optimal voltage level of the received signal by the resistor divider attenuation circuit.

Such a change in the carrier amplitude (and the signal amplitude) due to a change in the distance with respect to the reader/writer can be coped with by the variable forward-stage current drawing circuit 111a-2-3. Receiving signal intensity can also be modified by trimming of the resistor divider attenuation circuit 111a-2-1. Thereby, it is possible to interface or interact with more external circuits.

Next, descriptions are provided for the ASK receiving circuit for 100% ASK 111d.

The ASK receiving circuit for 100% ASK 111d is roughly divided into two sections; that is, it is configured, including a 100% ASK signal receiving terminal control circuit 111d-1 and a 100% ASK signal demodulation circuit 111d-2.

Further, the 100% ASK signal receiving terminal control circuit 111d-1 is configured, including a rectification circuit 111d-1-1, a clamp circuit 111d-1-2, and a diode-coupled MOS 111d-1-3.

The rectification circuit 111d-1-1 is a full-wave rectification circuit that rectifies a signal which is input from the transmitting terminals TP, TN.

The clamp circuit 111d-1-2 is a circuit for clamping a received signal to a given voltage. The clamp circuit 111d-1-2 enables the supply of a stable voltage power supply VCC. Thereby, the potentials of the transmitting terminals TP, TN remain at VCC+Vthd2 (where Vthd2 is a threshold voltage of the diode-coupled MOS 111d-1-3) when carrier amplitude is present and decrease from VCC+Vthd2 when carrier amplitude is absent.

No attenuation circuit is coupled to the transmitting terminals TP, TN, unlike the receiving terminals RXINP, RXINN. Therefore, if matching is obtained at 13.56 MHz to allow communication, the potentials of the transmitting terminals always remain at VCC+Vthd2. In a situation where carriers are only output, the potentials of the transmitting terminals will remain at VCC+Vthd2.

Owing to these rectification circuit 111d-1-1 and clamp circuit 111d-1-2, power can be supplied to allow the chip to operate during a battery-less operation.

The diode-coupled MOS 111d-1-3 is a circuit that performs envelope detection to enable extracting signal components only.

Then, an explanation is provided for why the 100% ASK signal receiving terminal control circuit 111d-1 is coupled to the transmitting terminals TP, TN.

When the antenna receives radio waves, a potential difference occurs between the transmitting terminals TP, TN. When there is a relation that TP>TN, FETs M2, M3 in the rectification circuit 111d-1-1 operate to supply a current from the TP to VCC. Inversely, FETs M1, M4 operate when there is a relation that TP<TN.

VCC is coupled to the circuits for receiving operation. Therefore, it is needed to keep VCC constant. For this reason, the clamp circuit 111d-1-2 is coupled to VCC and implements control to keep VCC at a given potential.

Enabling operation in the battery-less mode (from near range to long range) means a state where a VCC internal current can be supplied by the rectification circuit. In other words, VCC is maintained at a given potential by the clamp circuit 111d-1-2.

While VCC is maintained at a given potential, the transmitting terminals TP, TN are also maintained at a substantially given potential. The clamp circuit 111d-1-2 controls the potentials of the transmitting terminals TP, TN to be at a level VCC+(the threshold voltage of a FET M3).

In this state, when a 100% ASK modulated signal is input, the potentials of the transmitting terminals TP, TN become lower than the level of VCC+(the threshold voltage of the FET M3) and power cannot be supplied internally from the rectification circuit 111d-1-1. A consumption current during the input of 100% ASK modulated signals is supplied by a capacitor 111d-1-4 which is coupled to VCC.

During the input of unmodulated signals, the rectification circuit 111d-1-1 and the clamp circuit 111d-1-2 fix the transmitting terminals TP, TN to the potential of VCC+(the threshold voltage of the FET M3). Whereas, when 100% ASK modulated signals are input, the potentials of the transmitting terminals become lower than this potential of VCC+(the threshold voltage of the FET M3).

Consequently, the potentials of the transmitting terminals TP, TN are to change in a manner that it is easy for the 100%

ASK signal demodulation circuit to demodulate received signals. The reason is that the 100% ASK signal demodulation circuit 111d-2 can simply implement a demodulation operation by setting a threshold value to a potential lower than the potential of VCC+(the threshold voltage of the FET M3).

For the reason as above, coupling the ASK signal receiving circuit for 100% ASK 111d to the transmitting terminals TP, TN makes it possible to carry out the present invention with simple circuitry.

In the present invention, a circuit configuration is used that receives a transmission from a card and, when a potential decrease becoming lower than this occurs, detects that the potentials of the transmitting terminals have become lower than VCC+Vthd2, then receives 100% ASK signals. By adopting such a simple configuration, the 100% ASK signal (when received) demodulation circuit 111d-2 quits receiving 10% ASK signals. Although, this does not become a problem, because there is the 10% ASK signal demodulation circuit 111a-1.

Figure 10:
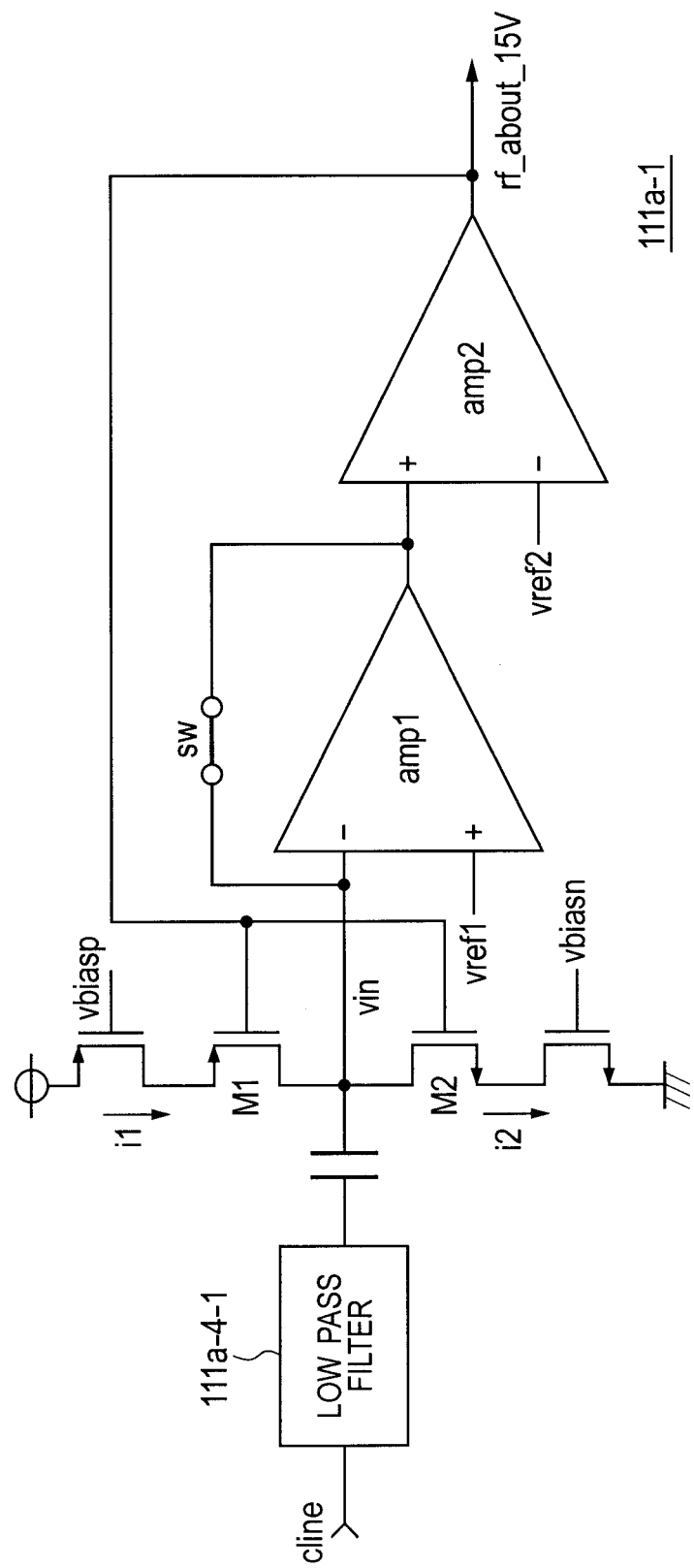
FIG. 10 is a circuit diagram representing a configuration of a 10% ASK signal (when received) demodulation circuit.

Next, descriptions are provided for the 10% ASK signal demodulation circuit 111a-1. FIG. 10 is a circuit diagram representing a configuration of the 10% ASK signal (when received) demodulation circuit 111a-1.

The 10% ASK signal demodulation circuit 111a-1 is a circuit that performs demodulation by modulated signal edge detection. Through "cline" (see FIG. 6) that is an output node for the 10% ASK receiving terminal signal control circuits 111a-2p, 111a-2n, a signal is input to the 10% ASK signal demodulation circuit 111a-1. To this "cline" node, an envelope detected signal by the diode-coupled MOS 111a-2-4 is input.

High frequency components of a signal input to the "cline" node are cut off by a low pass filter 111a-4-1 and edge signal components are only transferred through a coupling capacitor to an input Vin of an amplifier amp1.

Subsequently, descriptions are provided for an edge detection circuit portion following the input Vin.

The 10% ASK signal demodulation circuit 111a-1 may go into one of two states, as determined by an output rf_about_15v. These states are a falling edge wait state (when rf_about_15v is low (L)) and a rising edge wait state (when rf_about_15v is high (H)).

When rf_about_15v is L, a current i1 flows, but a current i2 does not flow in FIG. 10. Consequently, Vin fed back by the amplifier amp1 becomes stable at a voltage Vref1+V1 that is higher than a reference voltage Vref1. This state is the falling edge wait state.

In the falling edge wait state, when a falling edge more than V1 mentioned above is input to the "cline" node, the output rf_about_15v becomes high and the 10% ASK signal demodulation circuit transits into the rising edge wait state. By repeating this, it demodulates ASK signals.

ASK signals always have a falling edge following a rising edge and a rising edge always occurs following a falling edge. In other words, because a rising edge and a falling edge always occur alternately, it is possible to implement demodulation by the circuit configuration as above.

However, the 10% ASK signal demodulation circuit 111a-1 operates, triggered by an edge. For this reason, it completely demodulates 10% ASK signals, whereas it might erroneously demodulate 100% ASK signals.

Figure 11:
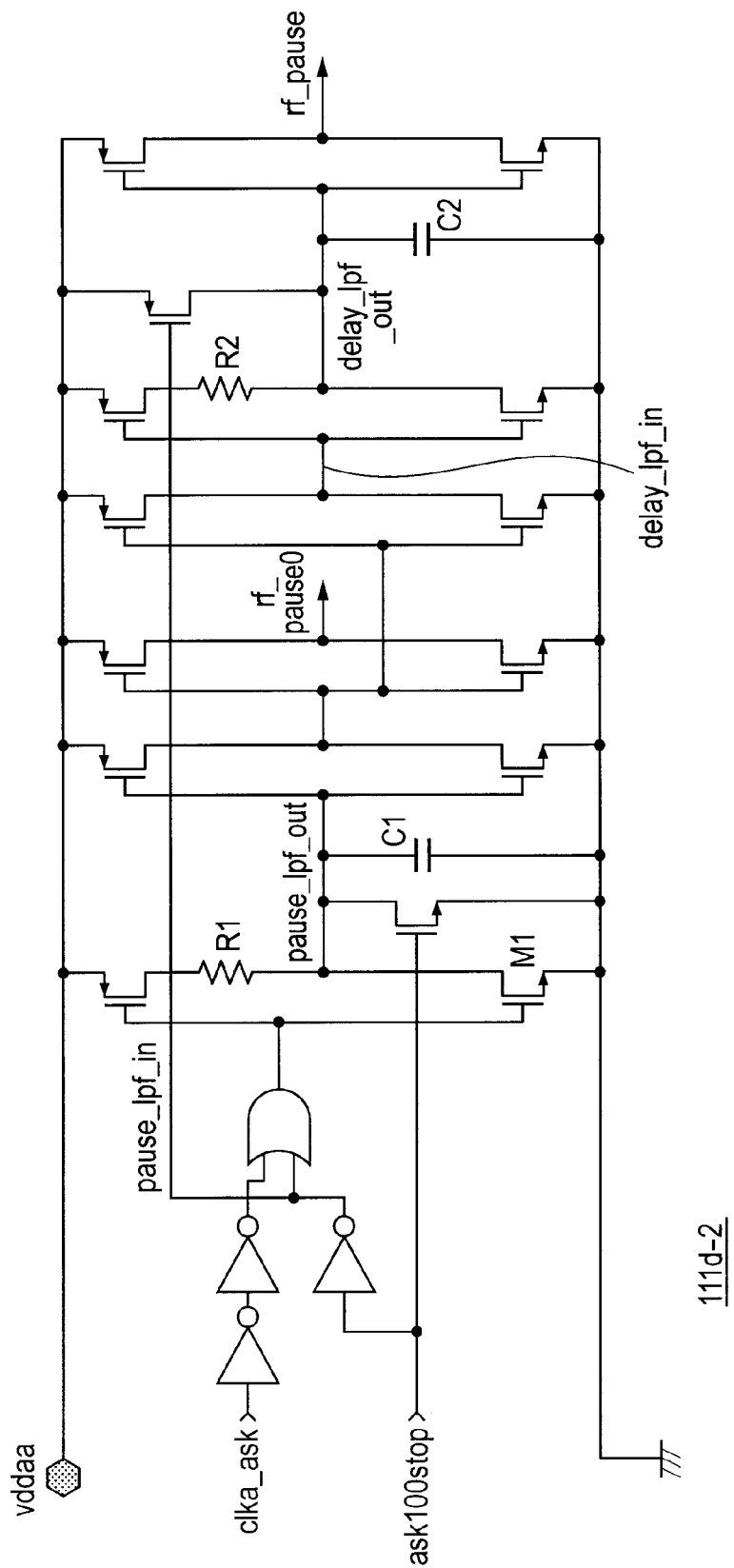
FIG. 11 is a circuit diagram representing a configuration of a 100% ASK signal demodulation circuit which is used in the present invention.
Figure 12:
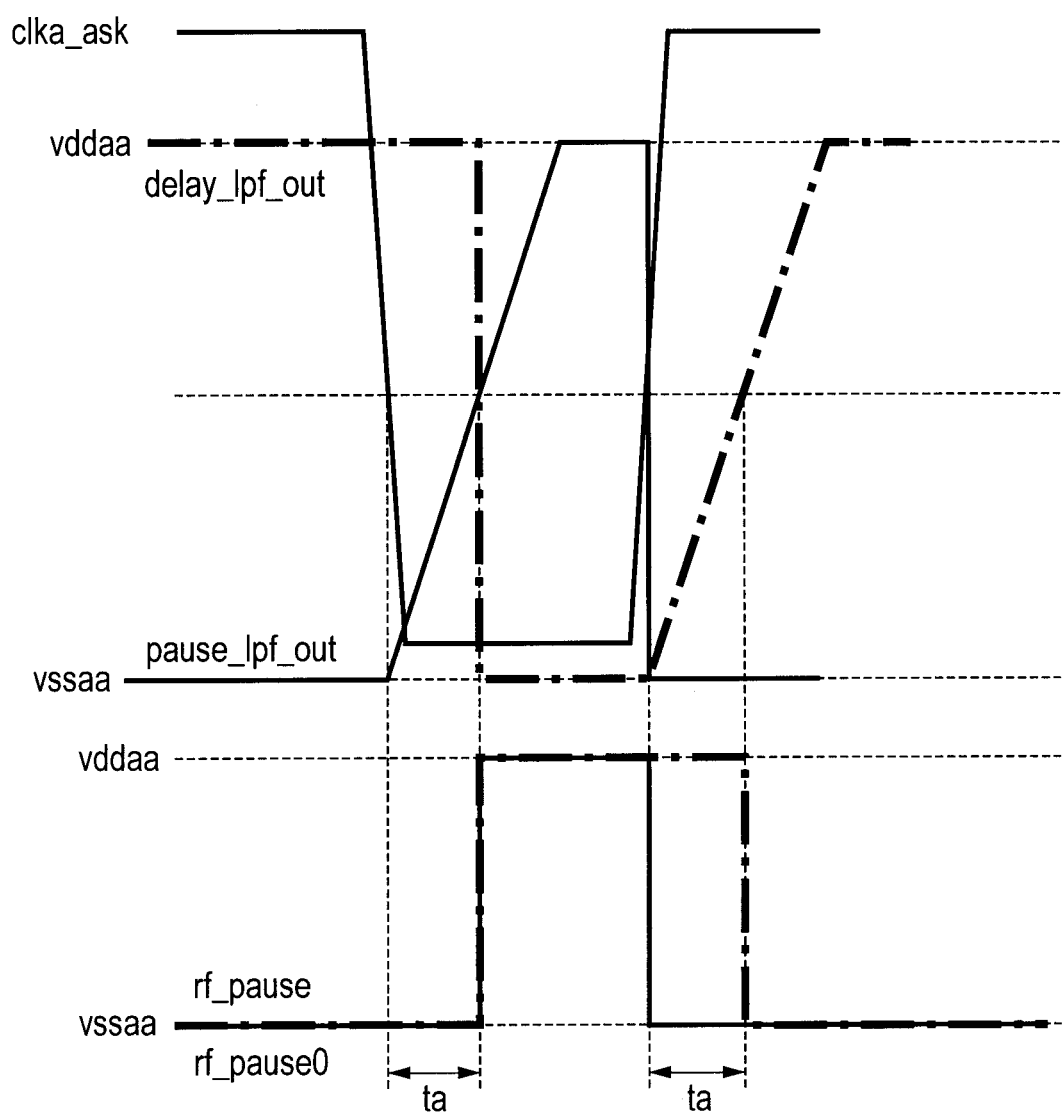
FIG. 12 is a conceptual diagram for explaining the operation of the 100% ASK signal demodulation circuit used in the present invention.

Next, descriptions are provided for the 100% ASK signal demodulation circuit 111d-2. FIG. 11 is a circuit diagram representing a configuration of a 100% ASK signal demodulation circuit which is used in the present invention. FIG. 12 is a conceptual diagram for explaining the operation of the 100% ASK signal demodulation circuit used in the present invention.

Unlike the 10% ASK signal demodulation circuit 111a-1 that uses an edge, this circuit judges whether or not an ASK signal is detected by the duration of an L (low potential) period of an input signal (clka_ask).

When the "clka_ask" signal becomes L, "pause_lpf_out" starts charging a capacitor C1. When "pause_lpf_out" becomes higher than an operating threshold value of an inverter, "rf_pause0" and "rf_pause" in FIG. 11 become H and "delay_lpf_out" in FIG. 11 becomes L.

Then, when the "clka_ask" signal becomes H, "rf_pause0" becomes L and "delay_lpf_out" starts charging a capacitor C2. When "delay_lpf_out" becomes higher than a threshold value of an inverter, "rf_pause" becomes L and "rf_pause" detection terminates. The detection is delayed by a time duration to as represented by a waveform shown in FIG. 12, but an L period of the "clka_ask" signal can be detected substantially exactly.

The 100% ASK signal demodulation circuit 111d-2 operates, triggered by a level. Thus, the 100% ASK signal demodulation circuit 111d-2 can be arranged to be able to completely demodulate 100% ASK signals only, but not to operate for 10% ASK signals at all.

Finally, descriptions are provided for a method for sharing a demodulation logic circuit disposed after the ASK signal receiving circuits in the R/W mode, card mode, and batteryless mode.

Because the ASK signal receiving circuits in the R/W mode are coupled to the receiving circuits RXINP, RXINN, the output of the 10% ASK signal receiving circuit and the output of the 100% ASK signal receiving circuit are often output from a same single terminal. However, as for the ASK signal receiving circuits for low consumption current disclosed herein, one for 10% ASK is coupled to the receiving terminals RXINP, RXINN, whereas the other for 100% ASK is coupled to the transmitting terminals TP, TN. Thus, there are two terminals, one for the output of the 10% ASK signal receiving circuit and the other for the output of the 100% ASK signal receiving circuit.

Therefore, in order to share the demodulation logic circuit in all modes, it is needed to combine both the output of the 10% ASK signal receiving circuit and the output of the 100% ASK signal receiving circuit into a single terminal output.

Figure 13:
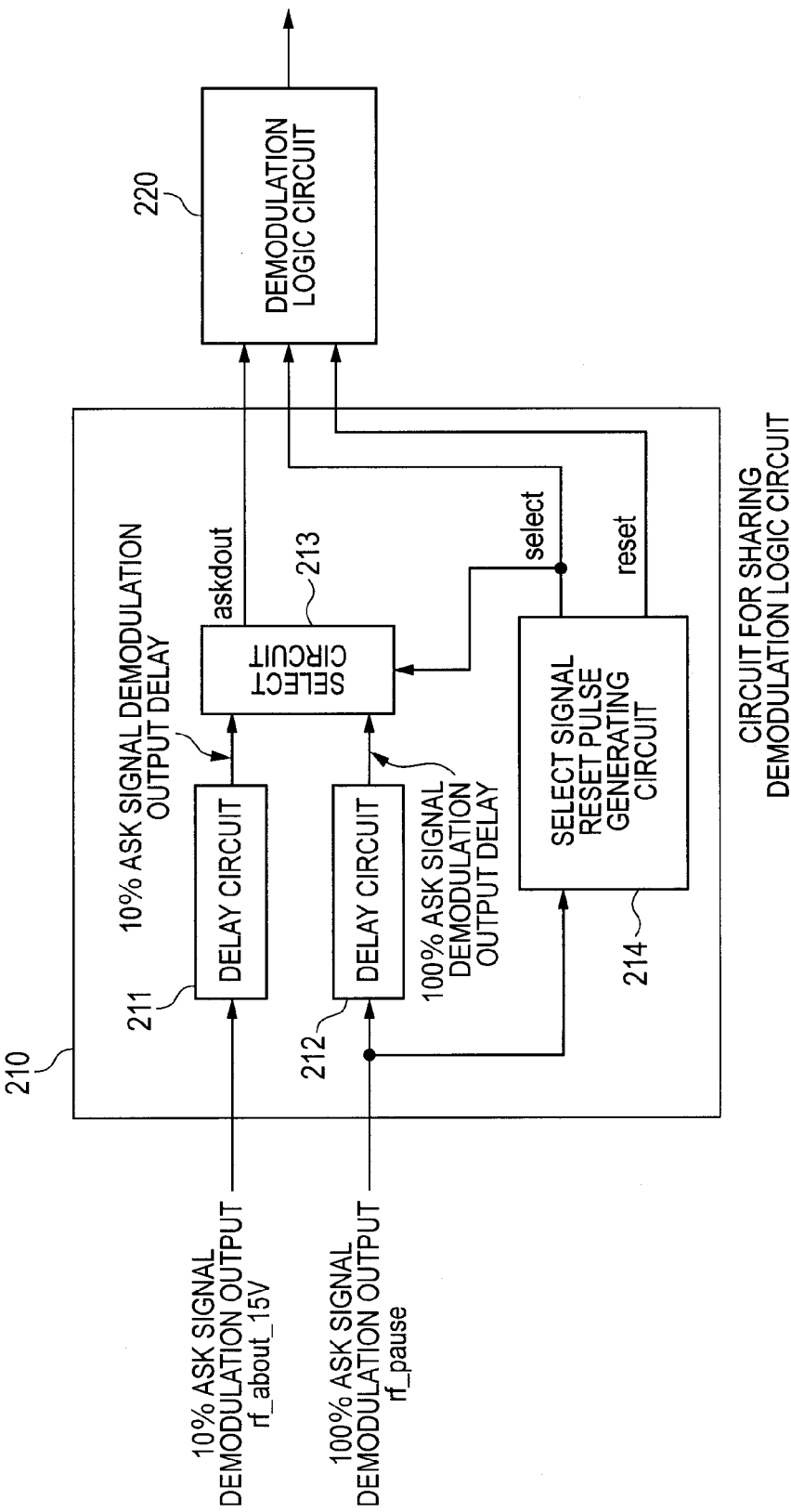
FIG. 13 is a circuit diagram of a circuit for sharing a demodulation logic circuit in relation to the first embodiment of the present invention.
Figure 14:
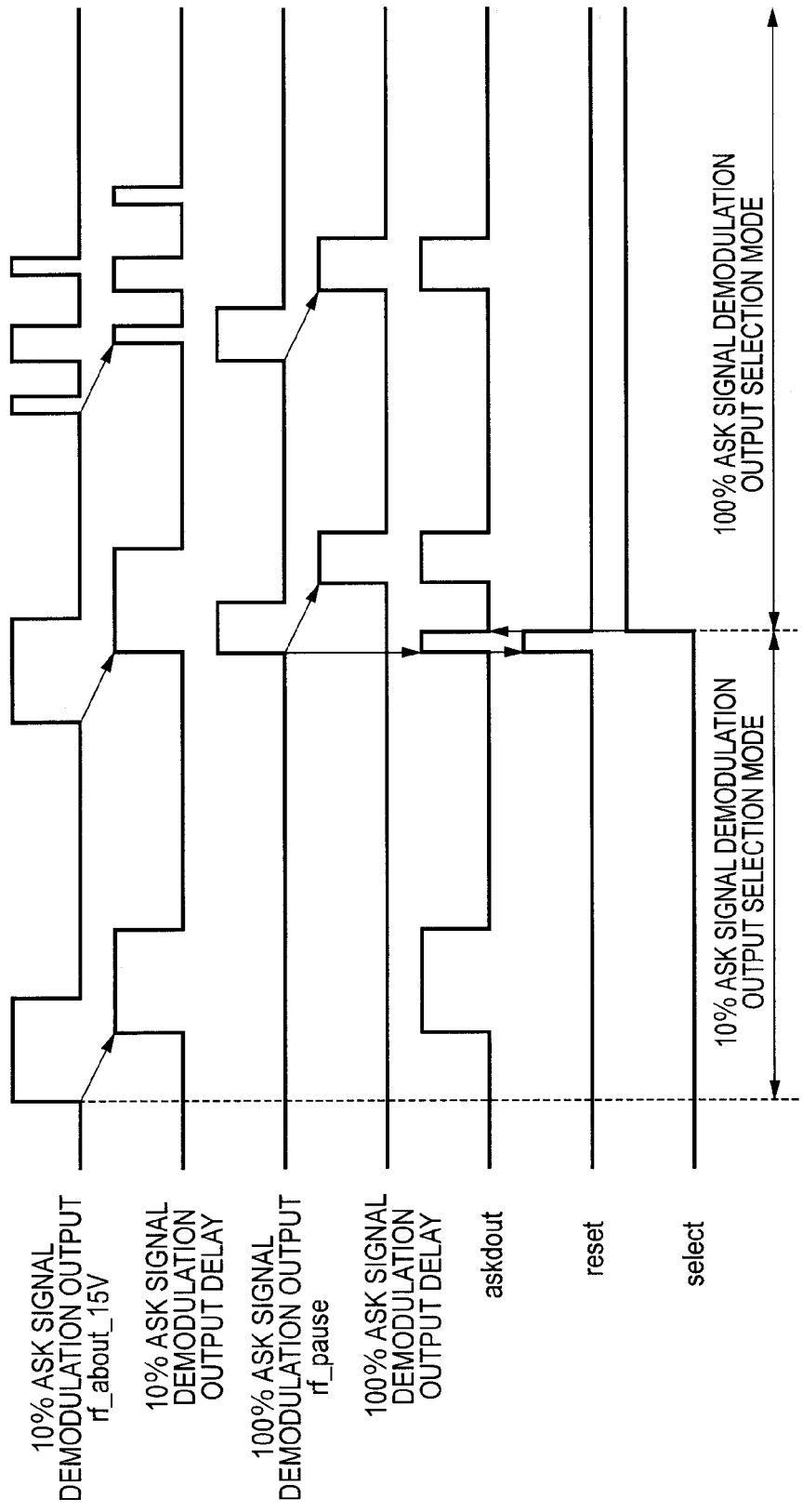
FIG. 14 is a waveform diagram concerning an operation for sharing the demodulation logic circuit in relation to the first embodiment of the present invention.
Figure 25:
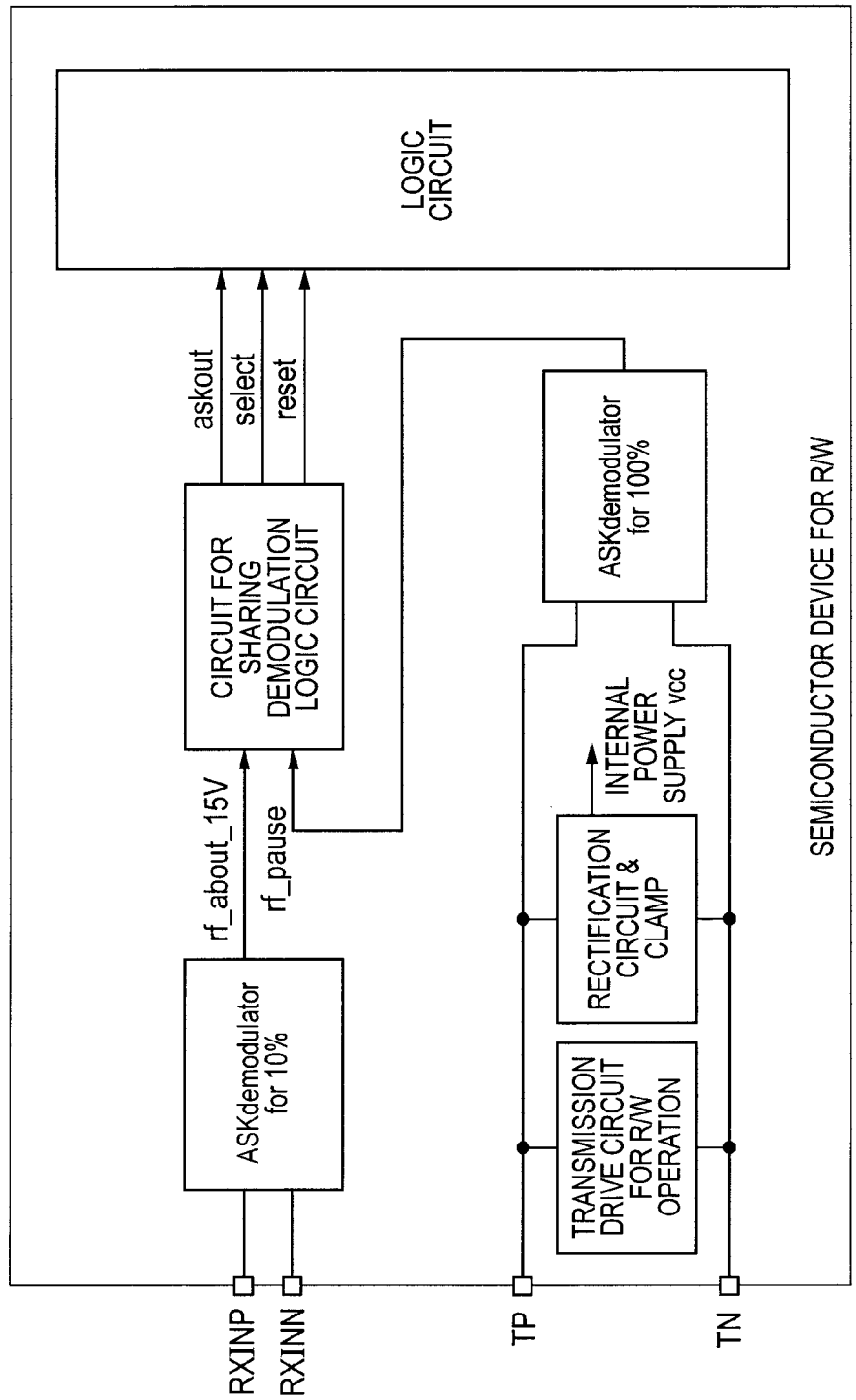
FIG. 25 is a circuit diagram representing how the circuit for sharing the demodulation logic circuit is positioned in the entire circuitry of the semiconductor device.

FIG. 13 is a circuit diagram of a circuit for sharing the demodulation logic circuit in relation to the first embodiment of the present invention. FIG. 14 is a waveform diagram concerning an operation for sharing the demodulation logic circuit in relation to the first embodiment of the present invention. Besides, FIG. 25 is a circuit diagram representing how the circuit for sharing the demodulation logic circuit is positioned in the entire circuitry of the semiconductor device.

In the present embodiment, the circuit arranged to produce a single terminal output is configured with delay circuits 211, 212, a signal select circuit 213, and a select signal reset pulse generating circuit 214.

As described previously, the 10% ASK signal demodulation circuit 111a-1 completely demodulates 10% ASK signals, whereas it might erroneously demodulate 100% ASK signals. Conversely, the 100% ASK signal demodulation circuit 111d-2 is able to completely demodulate 100% ASK signals only, but does not react to 10% ASK signals at all.

More specifically, an overshoot/undershoot of a modulated signal is defined to disable erroneous demodulation and the overshoot/undershoot for 100% ASK signals is larger than that of a modulated signal component for 10% ASK signals.

Hence, a circuit configuration adapted not to erroneously demodulate 100% ASK signals beyond the overshoot/undershoot does not erroneously demodulate 10% ASK signals.

An explanation is here provided with regard to the overshoot/undershoot.

Figure 15:
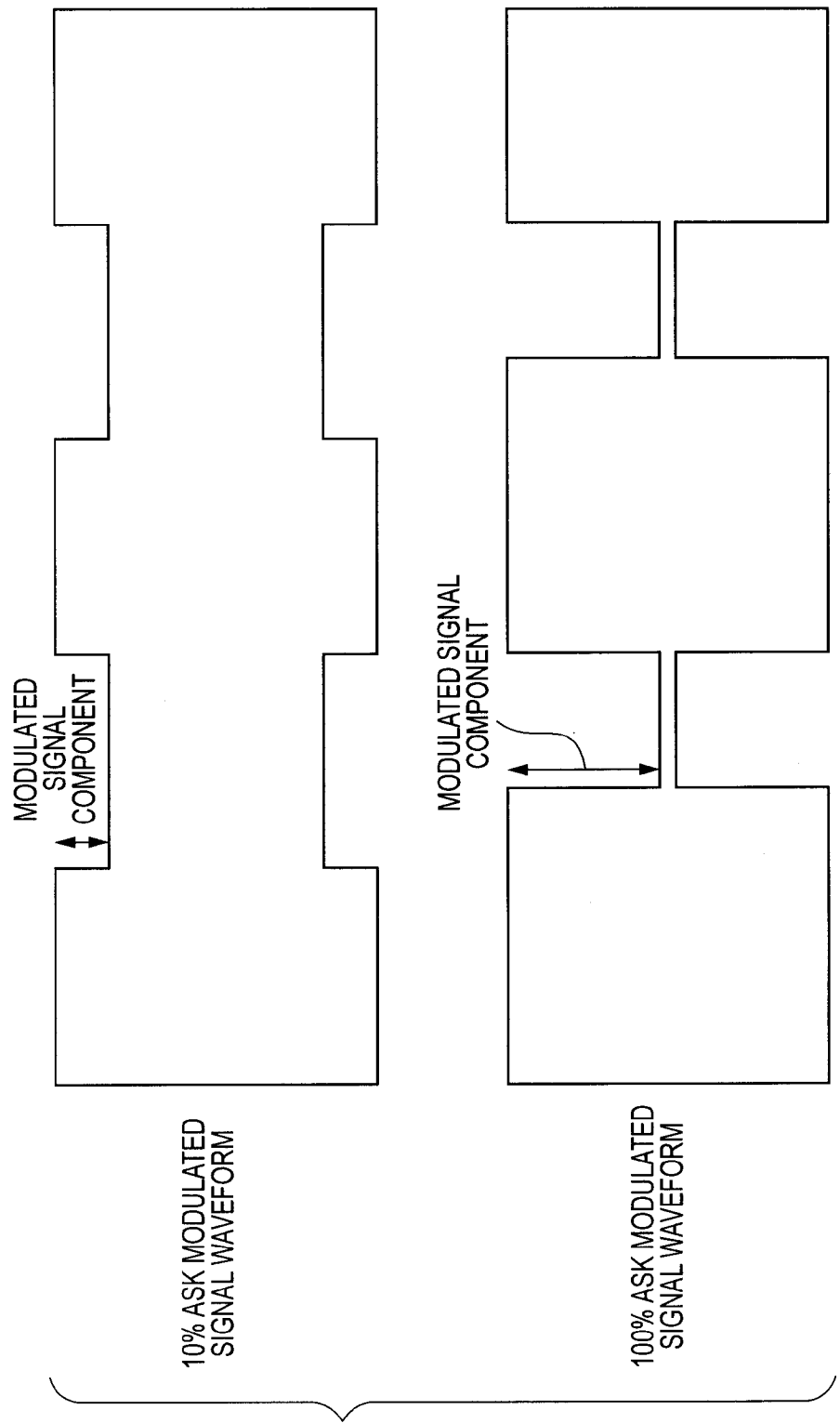
FIG. 15 is a waveform diagram showing two modulated signal waveforms, one modulated at a modulation depth of 10% and the other modulated at a modulation depth of 100%.
Figure 16:
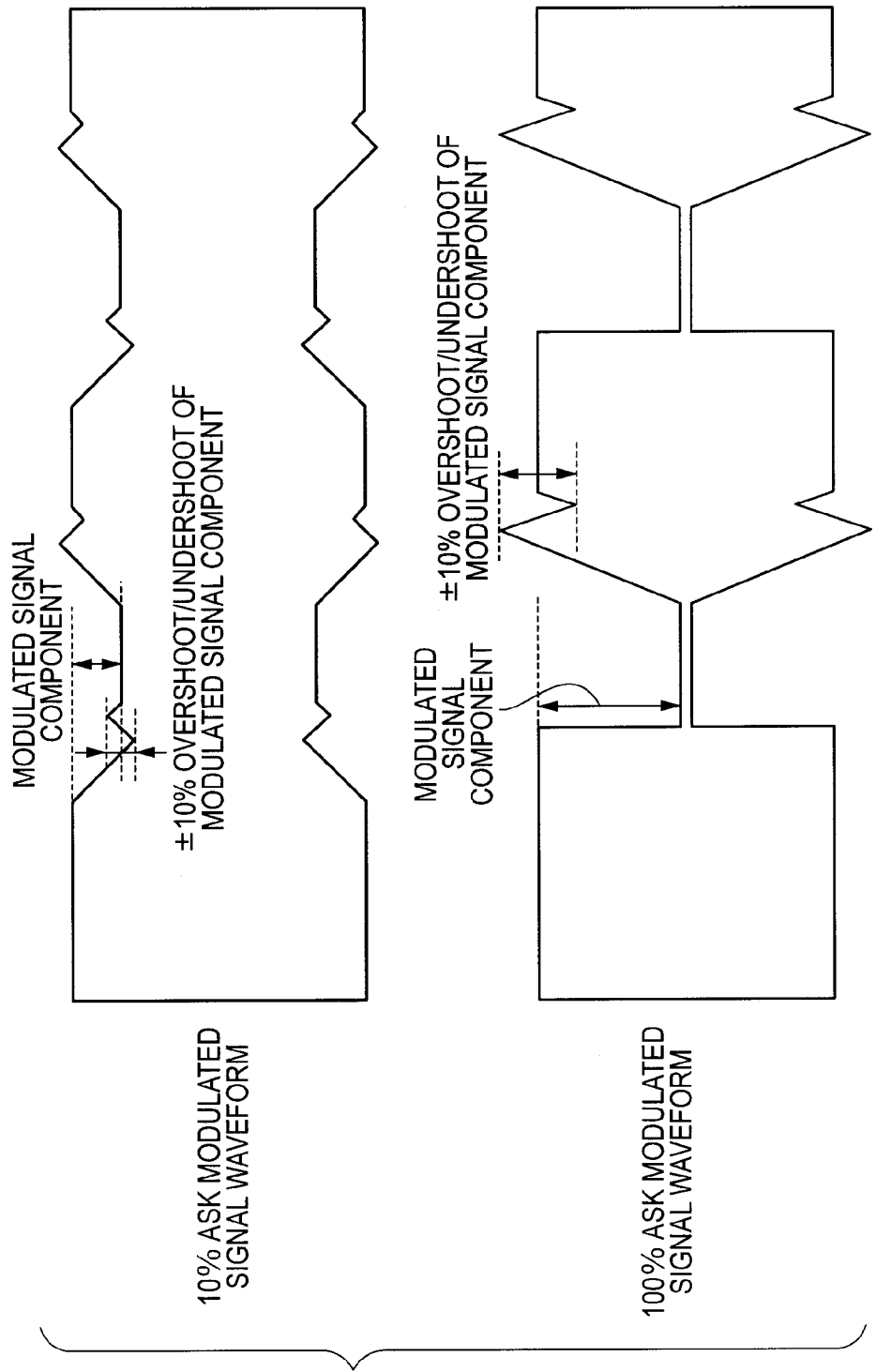
FIG. 16 is a conceptual diagram representing overshoot/undershoot specifications for the signal waveforms modulated at the respective modulation depths.

FIG. 15 is a waveform diagram showing two modulated signal waveforms, one modulated at a modulation depth of 10% and the other modulated at a modulation depth of 100%. FIG. 16 is a conceptual diagram representing an overshoot/undershoot specification for the signal waveforms modulated at the respective modulation depths.

Signals to be received in NFC are Amplitude Shift Keying (ASK) signals. According to modulation depth, there are type B, Felica (type C) modulated at a modulation depth of 10% and type A modulated at a modulation depth of 100%. Leaving coding schemes, transmission rates, etc. out of consideration, the respective modulation depths and the signals modulated at these depths are only discussed here.

The overshoot/undershoot specification is basically a range of ±10% of a modulated signal component. Signals beyond this overshoot/undershoot range must not be demodulated erroneously. In comparison in terms of amplitude between a waveform portion of the overshoot/undershoot of a signal modulated at a modulation depth of 100% and a signal component modulated at a modulation depth of 10%, the waveform portion of the overshoot/undershoot of the former signal is larger. In other words, when handling both 10% ASK and 100% ASK modulated signals, it results in waveforms that are more likely to be demodulated erroneously.

The 100% ASK signal receiving circuit having the circuit configuration disclosed in the present invention is also adapted not to erroneously demodulate 100% ASK signals beyond the overshoot/undershoot. Thus, this circuit does not erroneously demodulate 10% ASK signals as well.

Refer to FIG. 13 showing the circuit for producing a single terminal output. When a 10% ASK signal demodulation output rf_about_15v and a 100% ASK signal demodulation output rf_pause are input, signals delayed by the delay circuits, i.e., a 10% ASK signal demodulation output delay and a 100% ASK signal demodulation output delay are output. Basically, the circuit initially operates in a 10% ASK signal demodulation output select mode. Thus, the select signal reset pulse generating circuit 214 selects the 10% ASK signal demodulation output delay signal by default and outputs askdout.

When a 100% ASK signal is input, a select signal and a reset pulse is generated by the select signal reset pulse generating circuit 214. The select signal is input to the select circuit 213 and the select circuit 213 selects the 100% ASK signal demodulation output delay as askdout. This select signal is also input to the demodulation logic circuit 220 and indicates to the demodulation logic circuit 220 that the 100% ASK signal demodulation output is input.

The reset pulse that is output by the select signal reset pulse generating circuit 214 is input to the demodulation logic circuit 220 and resets the demodulation logic circuit 220. This sequence is all performed during a delay caused by the delay circuits 211, 212. A circuit designer should design this circuit to allow a delay time enough to complete the processing.

The delay circuits 211, 212 enable the demodulation logic circuit to reliably receive 100% ASK signal demodulation output from its first pulse. When receiving 100% ASK signals, the demodulation logic circuit can regard signals received before it is reset as noise and thus these signals all become unnecessary. Therefore, it is possible to avoid a risk of erroneous demodulation.

As described above, by receiving 10% ASK modulated signals and 100% ASK modulated signals at separate input terminals, the receiving terminals RXINP, RXINN can be optimally designed to receive only 10% ASK modulated signals and the transmitting terminals TP, TN can be optimally designed to receive only 100% ASK modulated signals.

In a case where 10% modulated ASK signals and 100% modulated ASK signals are received at only a single pair of receiving terminals RXINP, RXINN, a terminal amplitude control circuit and a demodulation circuit that can receive little modulated 10% ASK modulated signals and largely modulated 100% ASK modulated signals simultaneously are needed. Since it is impossible to design a terminal amplitude control circuit capable of optimally receiving both signals, the circuit should be configured to make it possible to receive both signals in some way. Therefore, the terminal amplitude control circuit and the ASK demodulation circuit become complicated and it would be very difficult to design them.

In the present invention, both signals are received at two pairs of terminals. So, the terminal amplitude control circuit and the ASK demodulation circuit for the receiving terminals RXINP, RXINN may only be designed in consideration of only receiving little modulated 10% ASK modulated signals and it will be much easier to design these circuits. In consequence, designing these circuits to consume less current and in smaller chip area can be realized.

Similarly, the terminal amplitude control circuit and the ASK receiving circuit for the transmitting terminals TP, TN may only be designed in consideration of only receiving largely modulated 100% ASK modulated signals. It will be easier to design these circuits and designing these circuits to consume less current and in smaller chip area can be realized.

Consequently, suitable terminal amplitude control circuits can be coupled to the receiving terminals RXINP, RXINN and the transmitting terminals TP, TN to make it easy to receive signals in accord with their targeted demodulation schemes (receiving ASK is described in the foregoing context, but applicable schemes are not restrictive to ASK).

Figure 17:
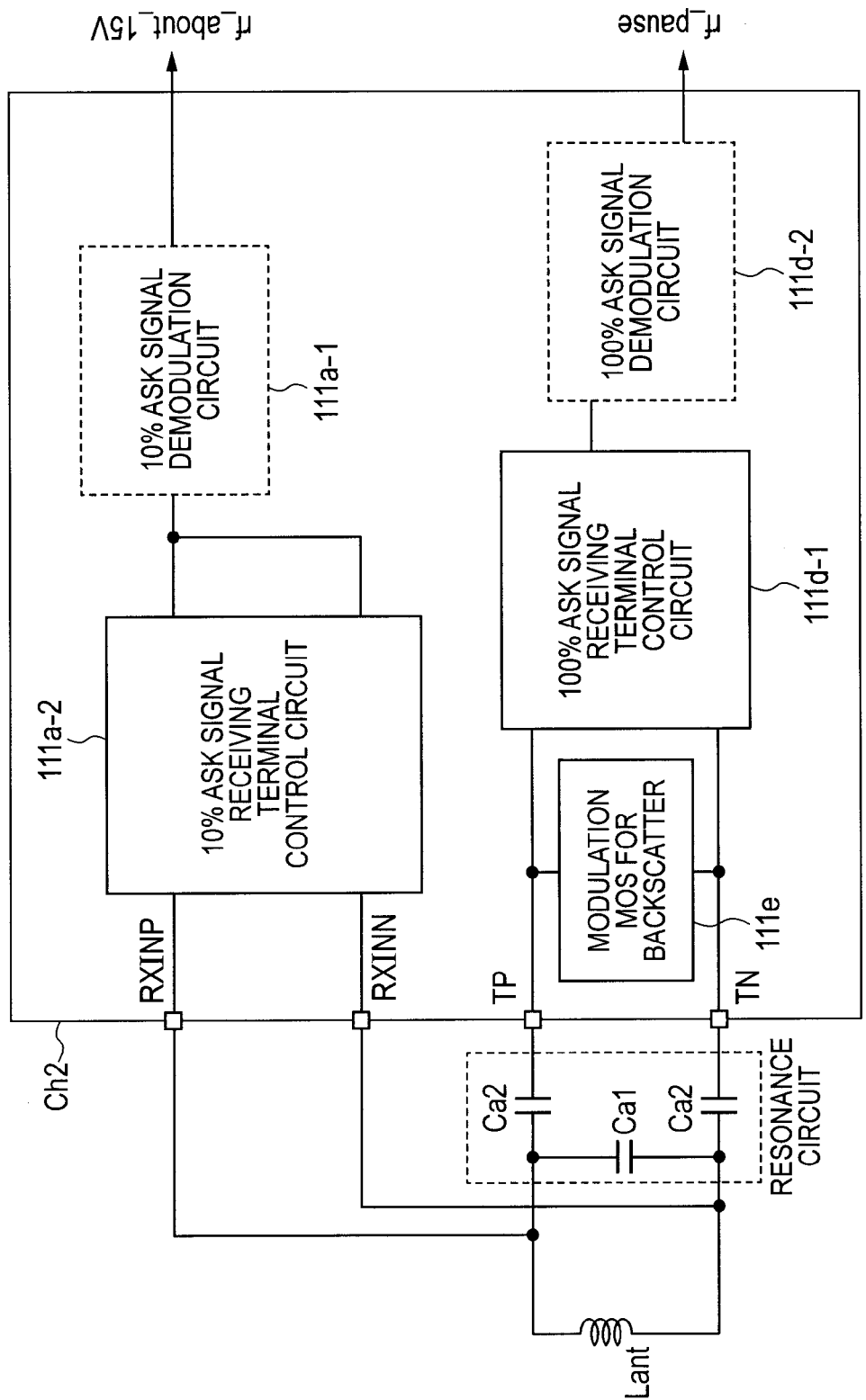
FIG. 17 is a circuit diagram representing a configuration of a semiconductor device for card to which the first embodiment of the present invention is applied.
Figure 18:
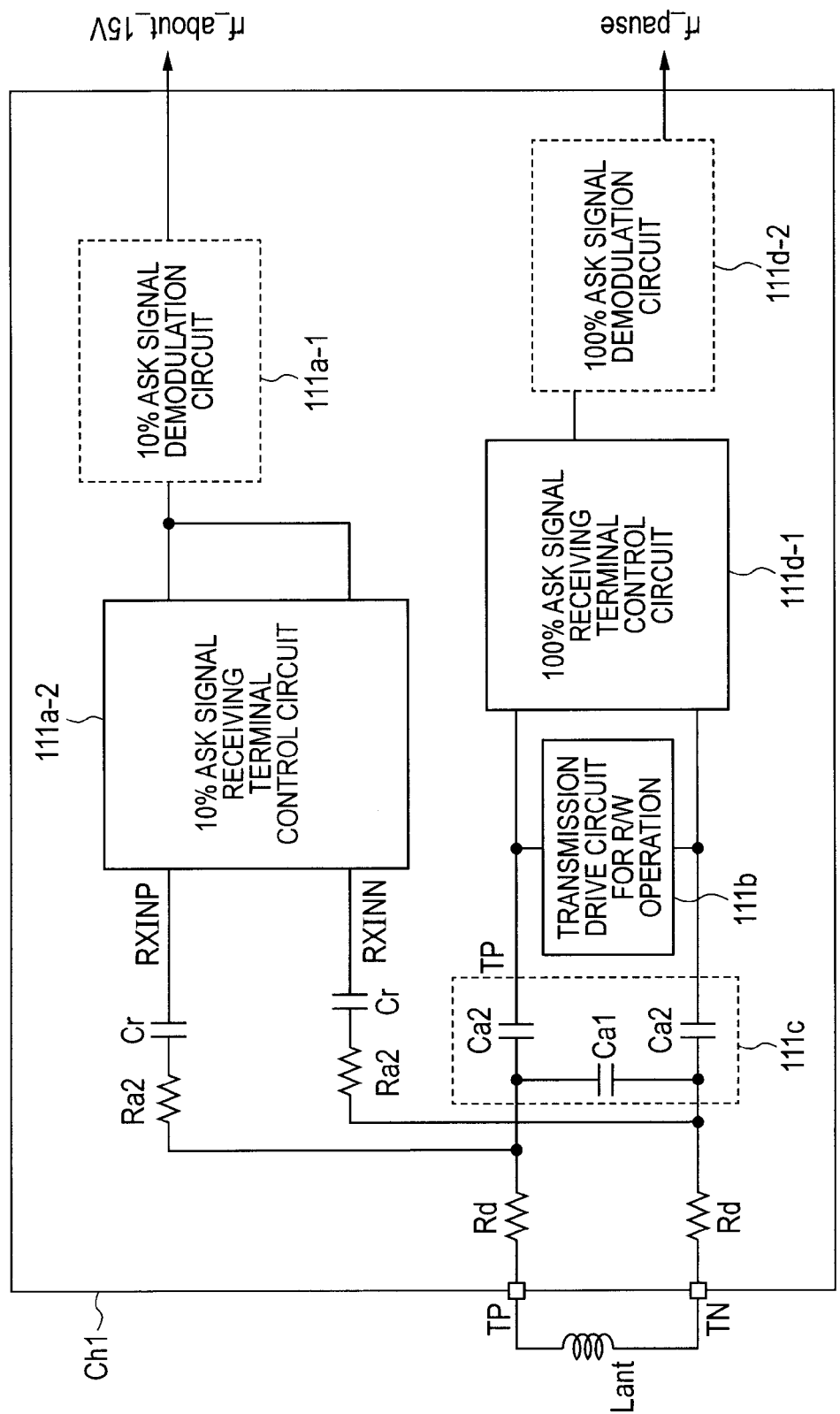
FIG. 18 is a circuit diagram representing another configuration of a semiconductor device for R/W to which the first embodiment of the present invention is applied.

The embodiment has been described in the foregoing context, assuming its implementation in the semiconductor device for R/W Ch1, but this is not restrictive. Application to a semiconductor device for card Ch2 (i.e., a product designed on the assumption of application to a card and adapted so that it can also be used for a reader/writer) in which the transmission drive circuit for R/W operation 111b is replaced by a modulation MOS for backscatter 111e is also embraced in the scope of the present invention (see FIG. 17). In the foregoing description, the resonance circuit 111c is mounted outside the semiconductor device for R/W Ch1. As an alternative, the resonance circuit 111c may be mounted within the semiconductor device for R/W Ch1 (see FIG. 18); in this case, the semiconductor device may be configured to be provided with common terminals as external terminals and internal paths from these terminals diverge into the transmitting terminals TP, TN and the receiving terminals RXINP, RXINN. FIG. 17 is a circuit diagram representing a configuration of the semiconductor device for card Ch2 to which the first embodiment of the present invention is applied. FIG. 18 is a circuit diagram representing another configuration of the semiconductor device for R/W Ch1 to which the first embodiment of the present invention is applied.

Figure 19:
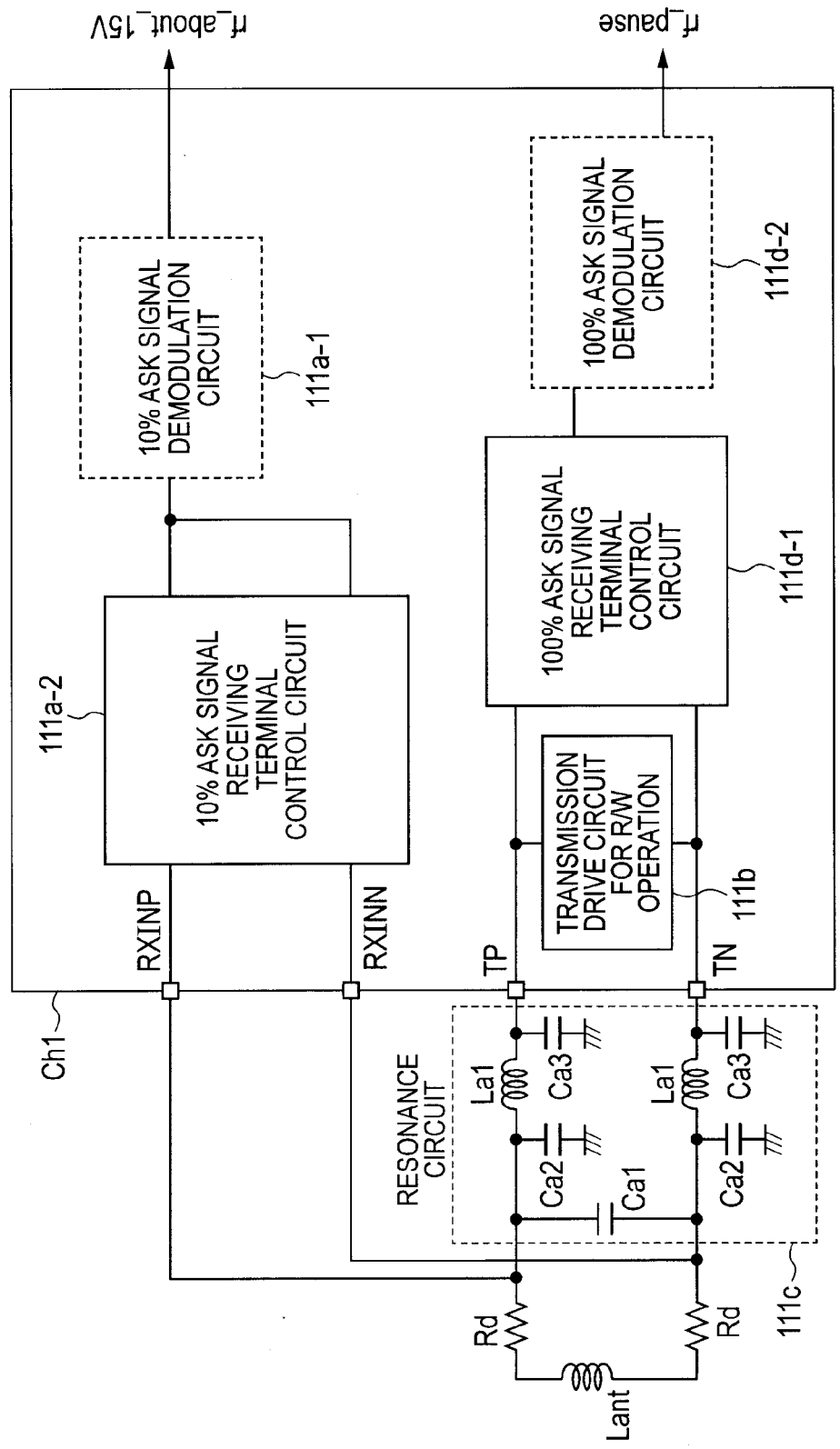
FIG. 19 is a circuit diagram representing another configuration of a semiconductor device for R/W to which the first embodiment of the present invention is applied.

The present invention does not depend on how the external resonance circuit 111c is configured. It should be preferred to configure the resonance circuit to optimally suit the device disclosed therein and a communication method used for it. FIG. 19 is a circuit diagram representing another configuration of the semiconductor device for R/W Ch1 to which the first embodiment of the present invention is applied. In this diagram, another resonance circuit 111c than that shown in the previous diagrams is used.

Figure 20:
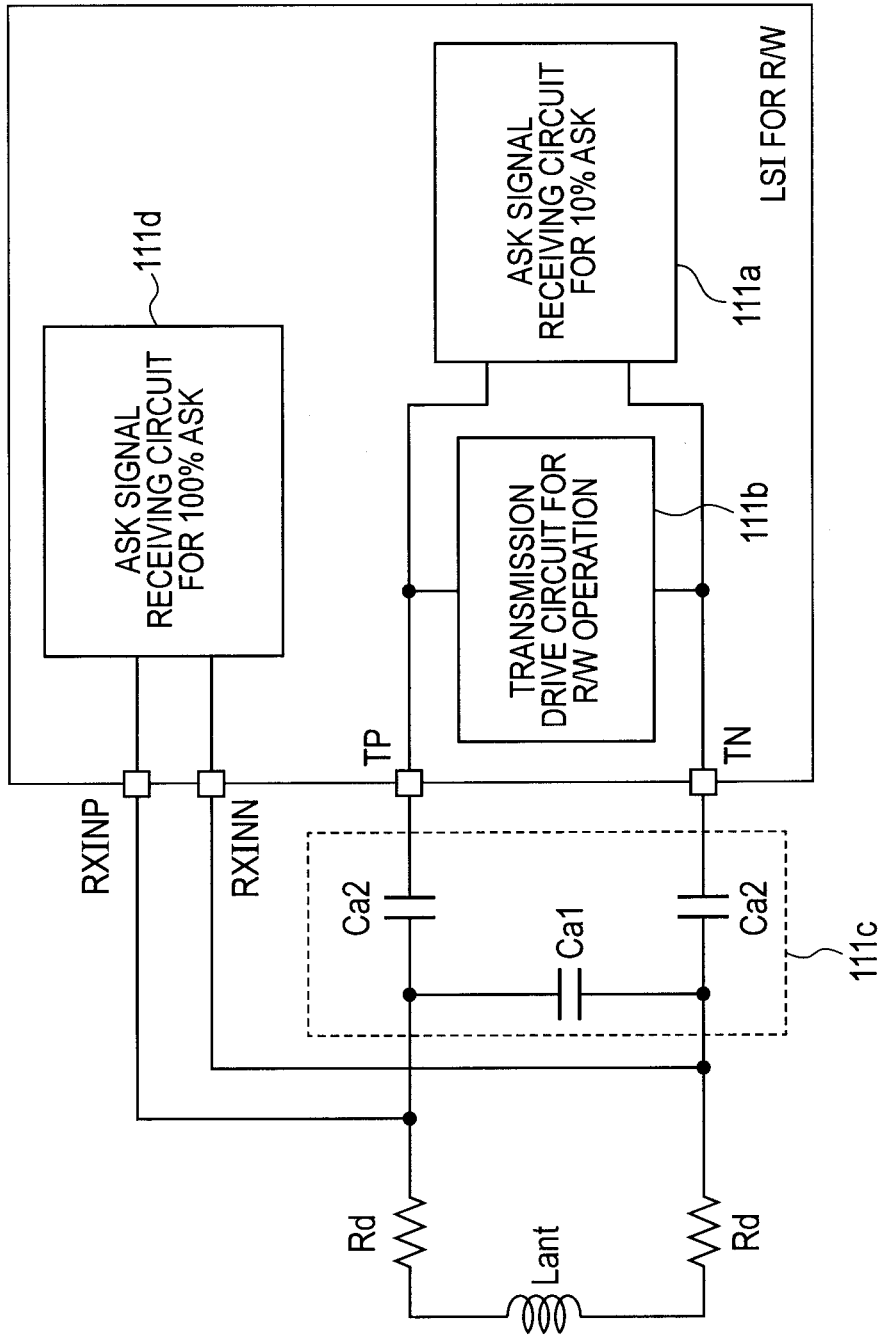
FIG. 20 is a circuit diagram representing another configuration of a semiconductor device for R/W to which the first embodiment of the present invention is applied, where an alternative arrangement of ASK circuits is adopted.

Moreover, in the foregoing context, the ASK signal receiving circuit for 10% ASK 111a is disposed on the side of the receiving terminals RXINP, RXINN and the ASK signal receiving circuit for 100% ASK 111d is disposed on the side of the transmitting terminals TP, TN. As an alternative, this circuitry may be configured such that the ASK signal receiving circuit for 100% ASK 111d is disposed on the side of the receiving terminals RXINP, RXINN and the ASK signal receiving circuit for 10% ASK 111a is disposed on the side of the transmitting terminals TP, TN. FIG. 20 is a circuit diagram representing another configuration of the semiconductor device for R/W Ch1 to which the first embodiment of the present invention is applied, where this alternative arrangement of the ASK circuits is adopted. This can likewise be applied to the semiconductor device for card shown in FIG. 18.

Figure 21:
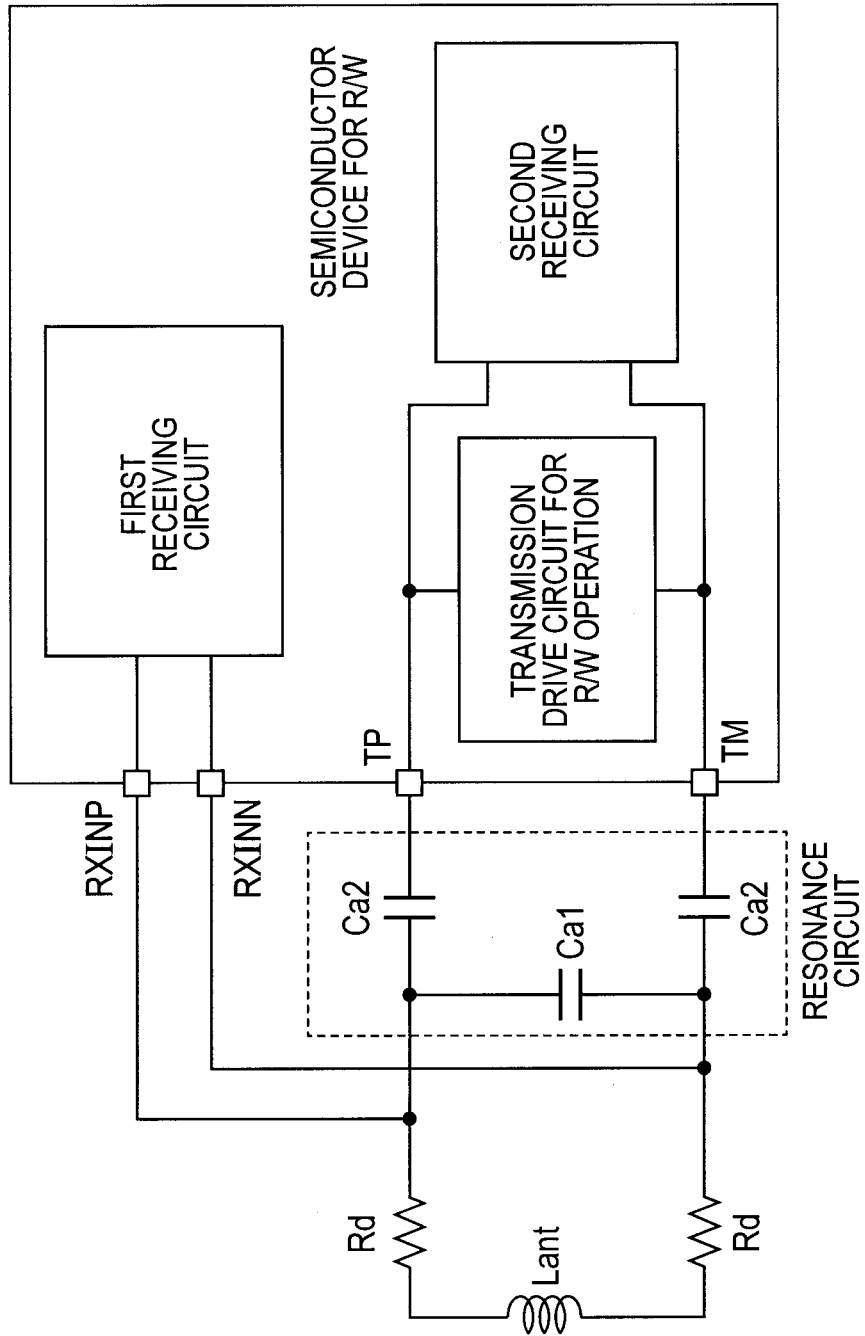
FIG. 21 is a circuit diagram representing another configuration of the semiconductor device for R/W Ch1 to which the first embodiment of the present invention is applied, where an arrangement alternative to the ASK circuits is adopted.

In addition, while application in NFC is assumed in the foregoing context, the present embodiment may be applied to communication methods other than NFC. FIG. 21 is a circuit diagram representing another configuration of the semiconductor device for R/W Ch1 to which the first embodiment of the present invention is applied, where an arrangement alternative to the ASK circuits is adopted.

Figure 22:
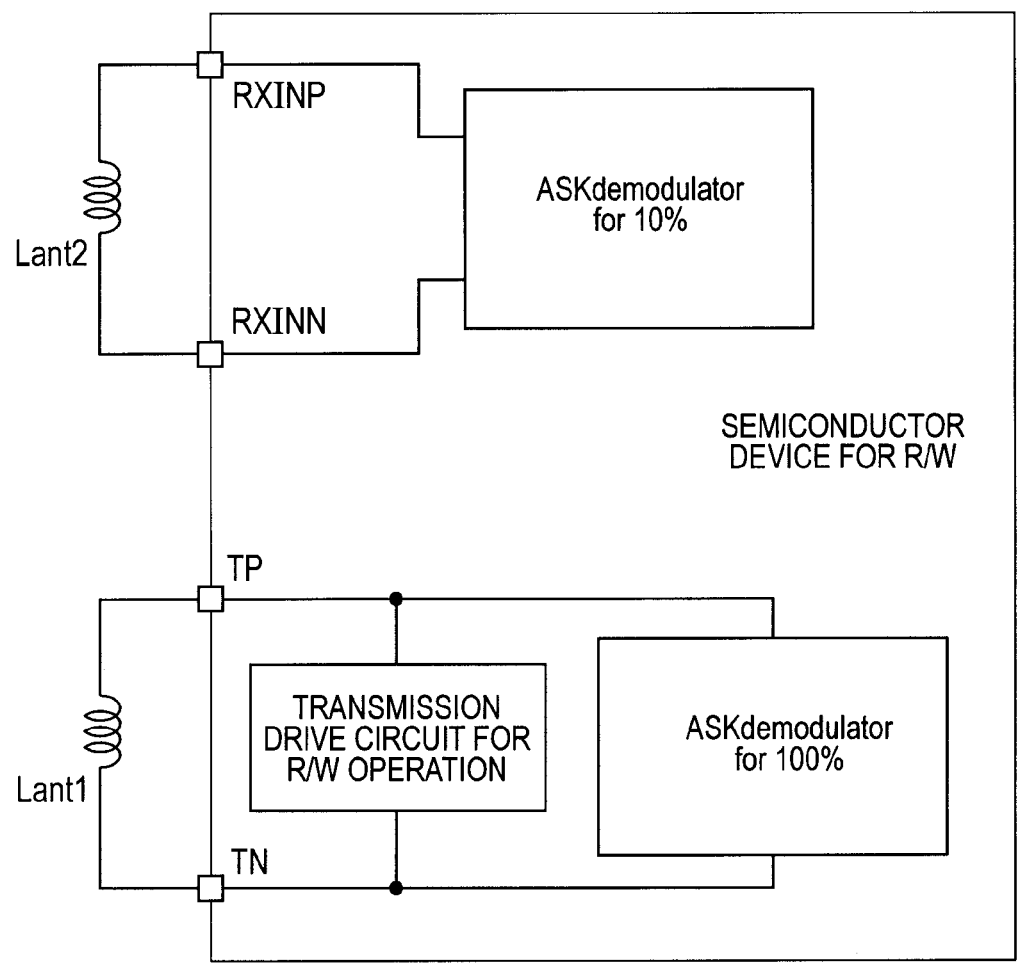
FIG. 22 is a circuit diagram representing another configuration of a semiconductor device for R/W to which the first embodiment of the present invention is applied, where an alternative arrangement of antennas is adopted.

Further, respective antennas may be arranged for the transmitting terminals TP, TN and the receiving terminals RXINP, RXINN, as shown in FIG. 4. FIG. 22 is a circuit diagram representing another configuration of the semiconductor device for R/W Ch1 to which the first embodiment of the present invention is applied, where this alternative arrangement of antennas is adopted.

Figure 23:
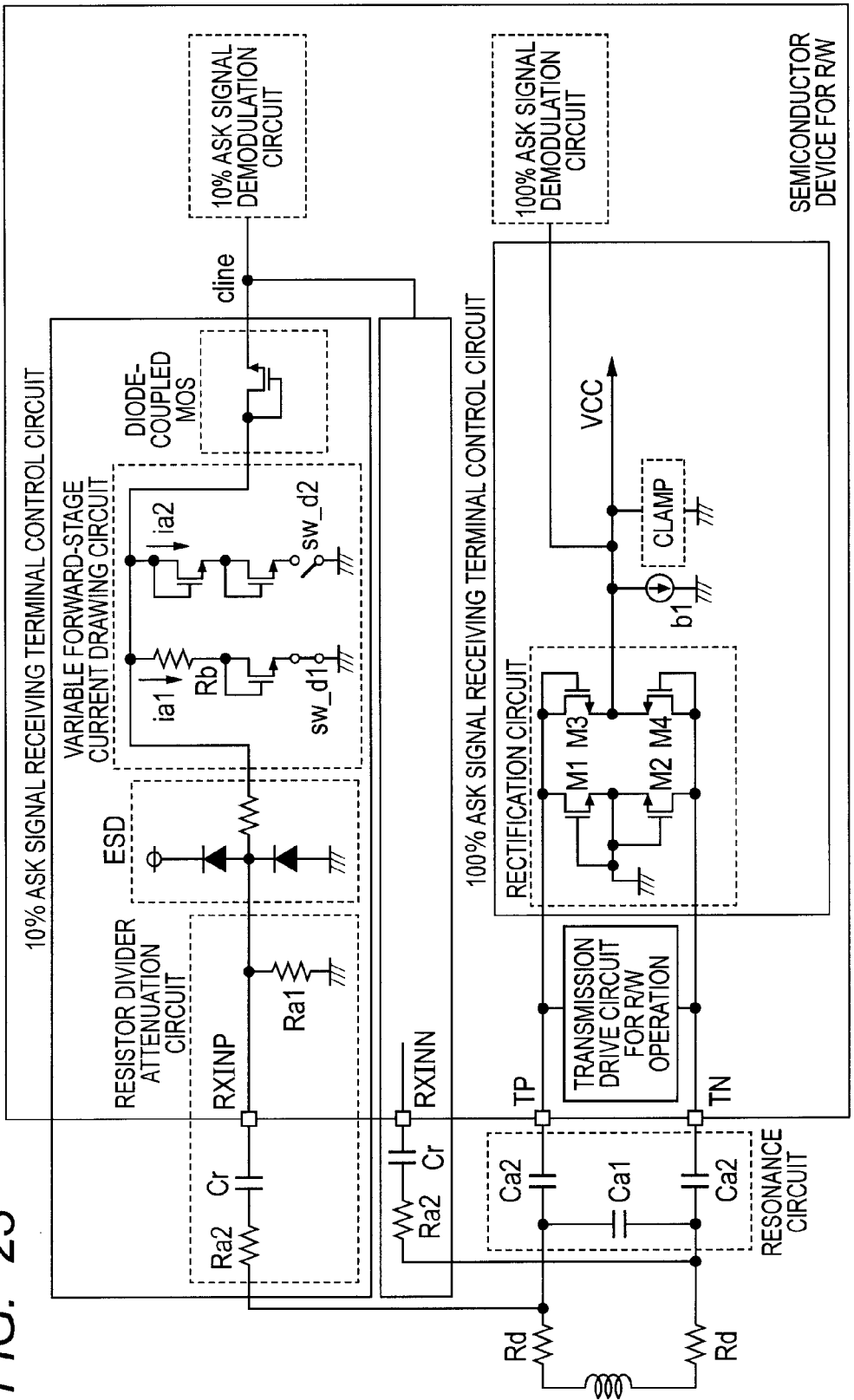
FIG. 23 is a circuit diagram representing another configuration of a semiconductor device for R/W to which the first embodiment of the present invention is applied, where a variant of a 100% ASK signal receiving terminal control circuit is shown.

It may also be possible to change the circuitry to which the 100% ASK signal demodulation circuit is coupled in FIG. 6. FIG. 23 is a circuit diagram representing another configuration of the semiconductor device for R/W Ch1 to which the first embodiment of the present invention is applied, where a variant of the 100% ASK signal receiving terminal control circuit is shown. It is also possible to generate envelope waveforms using a diode-coupled MOS in the rectification circuit. Although a current source b1 is inserted in the input path to the 100% ASK signal demodulation circuit, the device likewise operates without the current source b1, because an internal consumption current flows.

These modification examples are, of course, also embraced in the scope of the present invention.

While the invention made by the present inventors has been described specifically based on its embodiments hereinbefore, it will be obvious that the present invention is not limited to the described embodiments and various modifications may be made without departing from the scope of the invention.

In the foregoing context, application to a system that receives ASK signals used in NFC has been described. However, the application of the invention is not limited to this and this invention can be applied to ASK modulation/demodulation schemes using other modulation depths as well as systems.

What is claimed is:

1. A semiconductor device for wireless communication, comprising:
    a first demodulation circuit configured to demodulate a first ASK modulated signal;
    a second demodulation circuit configured to demodulate a second ASK modulated signal which is modulated at a smaller modulation depth than the first ASK modulated signal;
    a first pair of input pins receiving at least the first ASK modulated signal and coupled to the first demodulation circuit; and
    a second pair of input pins receiving at least the second ASK modulated signal, provided separately from the first pair of input pins and coupled to the second demodulation circuit; wherein:
    the second demodulation circuit includes a current drawing circuit and achieves matching by controlling the current drawing circuit.

2. The semiconductor device for wireless communication according to claim 1, further comprising a driver circuit that outputs a modulated signal to be transmitted by driving a separately provided antenna via the first pair of input pins.

3. The semiconductor device for wireless communication according to claim 2, wherein the first demodulation circuit is triggered by a level and the second demodulation circuit is triggered by an edge.

4. The semiconductor device for wireless communication according to claim 2, further comprising a circuit for sharing a demodulation logic circuit,
    wherein the circuit for sharing a demodulation logic circuit judges whether the first demodulation circuit or the second demodulation circuit is enabled and selects an output of the enabled receiving circuit as an output to the demodulation logic circuit.

5. The semiconductor device for wireless communication according to claim 1, further comprising a driver circuit that outputs a modulated signal to be transmitted by driving a separately provided antenna via the second pair of input pins.

6. The semiconductor device for wireless communication according to claim 1, wherein the first ASK modulated signal is modulated at a modulation depth of 100%.

7. The semiconductor device for wireless communication according to claim 6, wherein the second ASK modulated signal is modulated at a modulation depth of 10%.

8. A semiconductor device for wireless communication comprising:
    a first demodulation circuit to demodulate a first ASK modulated signal;
    a second demodulation circuit to demodulate a second ASK modulated signal; and
    a driver circuit to transmit a modulated signal,
    wherein the first demodulation circuit and the second demodulation circuit are coupled in parallel and input signals from a common pair of input pins are internally distributed within the semiconductor device and input to the first demodulation circuit and the second demodulation circuit; and
    a resistor divider attenuation circuit is interposed between the common pair of input pins and the second demodulation circuit.

9. The semiconductor device for wireless communication according to claim 8, further comprising:
    a resonance circuit configured to receive signal input from the common pair of input pins, the resonance circuit having an output coupled to the driver circuit and the first demodulation circuit, wherein:
    the driver circuit and the first demodulation circuit are both connected between a common pair of nodes.

10. The semiconductor device for wireless communication according to claim 8, further comprising:
    a range judgment circuit coupled to the common pair of input pins and providing an output to the first demodulation circuit; wherein:
    the first demodulation circuit is implemented with a variable threshold for demodulation; and the second ASK modulated signal is modulated at a deeper modulation depth than the first ASK modulated signal.

11. A semiconductor device for wireless communication, comprising:
a first demodulation circuit configured to demodulate a first ASK modulated signal;
a driver circuit to transmit a modulated signal, the driver circuit and the first demodulation circuit connected between a common pair of nodes;
a first pair of input pins for receiving at least the first ASK modulated signal and coupled to the driver circuit and the first demodulation circuit;
a second demodulation circuit configured to demodulate a second ASK modulated signal which is modulated at a different modulation depth than the first ASK modulated signal; and
a second pair of input pins separate from the first pair of input pins, for receiving at least the second ASK modulated signal, the second pair of input pins coupled to the second demodulation circuit; wherein:
the semiconductor device is connected to a first antenna, and wherein:
the first antenna is connected to the first pair of input pins via a resonance circuit; and
the first antenna is connected to the second pair of input pins via a resistor divider circuit.

12. A semiconductor device for wireless communication, comprising:
a first demodulation circuit configured to demodulate a first ASK modulated signal;
a driver circuit to transmit a modulated signal, the driver circuit and the first demodulation circuit connected between a common pair of nodes;
a first pair of input pins for receiving at least the first ASK modulated signal and coupled to the driver circuit and the first demodulation circuit;
a second demodulation circuit configured to demodulate a second ASK modulated signal which is modulated at a different modulation depth than the first ASK modulated signal; and
a second pair of input pins separate from the first pair of input pins, for receiving at least the second ASK modulated signal, the second pair of input pins coupled to the second demodulation circuit; wherein:
the semiconductor device is connected to:
a first antenna via the first pair of input pins without an intervening resonance circuit; and
a second antenna via the second pair of input pins, the second antenna being separate from the first antenna.

13. A semiconductor device for wireless communication, comprising:
a first demodulation circuit configured to demodulate a first ASK modulated signal;
a driver circuit to transmit a modulated signal, the driver circuit and the first demodulation circuit connected between a common pair of nodes;
a first pair of input pins for receiving at least the first ASK modulated signal and coupled to the driver circuit and the first demodulation circuit;
a second demodulation circuit configured to demodulate a second ASK modulated signal which is modulated at a different modulation depth than the first ASK modulated signal; and
a second pair of input pins separate from the first pair of input pins, for receiving at least the second ASK modulated signal, the second pair of input pins coupled to the second demodulation circuit; and further comprising:
a circuit for sharing a demodulation logic circuit comprising:
a first delay circuit receiving an output of the first demodulation circuit and producing a first delay output;
a second delay circuit receiving an output of the second demodulation circuit and producing a second delay output;
a selected signal reset pulse generating circuit connected to an output of the first demodulation circuit and producing a select output; and
a select circuit receiving the first and second delay outputs and the select output, and outputting one of the first and second delay outputs in response to the select output.

14. The semiconductor device for wireless communication according to claim 13, wherein:
in addition to outputting one of the first and second delay outputs in response to the select output, the circuit for sharing a demodulation logic circuit also outputs the select output and a reset output created by the selected signal reset pulse generating circuit.

15. A semiconductor device for wireless communication, comprising:
a first demodulation circuit configured to demodulate a first ASK modulated signal;
a driver circuit to transmit a modulated signal, the driver circuit and the first demodulation circuit connected between a common pair of nodes;
a first pair of input pins for receiving at least the first ASK modulated signal and coupled to the driver circuit and the first demodulation circuit;
a second demodulation circuit configured to demodulate a second ASK modulated signal which is modulated at a different modulation depth than the first ASK modulated signal; and
a second pair of input pins separate from the first pair of input pins, for receiving at least the second ASK modulated signal, the second pair of input pins coupled to the second demodulation circuit; and further comprising:
a circuit for sharing a demodulation logic circuit comprising:
a first delay circuit receiving an output of the first demodulation circuit and producing a first delay output;
a second delay circuit receiving an output of the second demodulation circuit and producing a second delay output;
a selected signal reset pulse generating circuit connected to an output of the first demodulation circuit and producing a select output; and
a select circuit receiving the first and second delay outputs and the select output, and outputting one of the first and second delay outputs in response to the select output;
a receiving terminal control circuit positioned between the second pair of input pins and the second demodulation circuit, the receiving terminal control circuit comprising:
a current drawing circuit having a plurality of selectively switchable current paths between a common node and ground; wherein:
at least one selectively switchable current path has a first number of diode-coupled MOSs in series with a resistor; and
at least one selectively switchable current path has said first number of diode-coupled MOSs and is devoid of resistors.

16. A semiconductor device for wireless communication, comprising:
- a first demodulation circuit configured to demodulate a first ASK modulated signal;
- a driver circuit to transmit a modulated signal, the driver circuit and the first demodulation circuit connected between a common pair of nodes;
- a first pair of input pins for receiving at least the first ASK modulated signal and coupled to the driver circuit and the first demodulation circuit;
- a second demodulation circuit configured to demodulate a second ASK modulated signal which is modulated at a different modulation depth than the first ASK modulated signal; and
- a second pair of input pins separate from the first pair of input pins, for receiving at least the second ASK modulated signal, the second pair of input pins coupled to the second demodulation circuit; and further comprising:
- a receiving terminal control circuit positioned between the second pair of input pins and the second demodulation circuit, the receiving terminal control circuit comprising:
- a current drawing circuit having a plurality of selectively switchable current paths between a common node and ground; wherein:
  - a first number of selectively switchable current paths have at least one diode-coupled MOSs in series with resistors of different resistance values; and
  - a second number of selectively switchable current paths are devoid of resistors.

17. A semiconductor device for wireless communication, comprising:
- a first demodulation circuit configured to demodulate a first ASK modulated signal;
- a driver circuit to transmit a modulated signal, the driver circuit and the first demodulation circuit connected between a common pair of nodes;
- a first pair of input pins for receiving at least the first ASK modulated signal and coupled to the driver circuit and the first demodulation circuit;
- a second demodulation circuit configured to demodulate a second ASK modulated signal which is modulated at a different modulation depth than the first ASK modulated signal; and
- a second pair of input pins separate from the first pair of input pins, for receiving at least the second ASK modulated signal, the second pair of input pins coupled to the second demodulation circuit; and further comprising:
- a receiving terminal control circuit positioned between the second pair of input pins and the second demodulation circuit, the receiving terminal control circuit comprising:
- a plurality of resistors, each resistor connected between a common node and ground via a corresponding switch; wherein:
  - the common node is connected to a first of the second pair of inputs pins; and
  - turning on/off a corresponding switch adjusts a resistor divider attenuation associated with the second demodulation circuit.

\* \* \* \* \*